(12) United States Patent
Murai

(10) Patent No.: US 6,847,083 B2
(45) Date of Patent: Jan. 25, 2005

(54) SEMICONDUCTOR DEVICE, ELECTRO-OPTIC DEVICE, AND ELECTRONIC INSTRUMENT

(75) Inventor: Ichiro Murai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 167 days.

(21) Appl. No.: 10/314,129

(22) Filed: Dec. 9, 2002

(65) Prior Publication Data

US 2003/0107127 A1 Jun. 12, 2003

(30) Foreign Application Priority Data

Dec. 11, 2001 (JP) ........................................ 2001-377297

(51) Int. Cl.[7] .............................................. H01L 23/62
(52) U.S. Cl. ........................ 257/360; 257/356; 257/361
(58) Field of Search ................................ 257/173, 174, 257/355, 356, 360, 361, 362

(56) References Cited

U.S. PATENT DOCUMENTS

| | | | | |
|---|---|---|---|---|
| 4,876,584 A | * | 10/1989 | Taylor | ........................ 257/358 |
| 5,182,220 A | * | 1/1993 | Ker et al. | ................... 438/200 |
| 6,078,068 A | * | 6/2000 | Tamura | ....................... 257/203 |
| 6,169,312 B1 | * | 1/2001 | Hiraga | ....................... 257/360 |

FOREIGN PATENT DOCUMENTS

JP          05-307191         11/1993

* cited by examiner

*Primary Examiner*—Ngan V Ngo
(74) *Attorney, Agent, or Firm*—Oliff & Berridge, PLC

(57) ABSTRACT

This invention provides a semiconductor device that does not cause a defect at an intersection of wirings even when a surge voltage enters from a signal input terminal, an electro-optic device provided with the semiconductor device as a TFT array substrate, and an electronic instrument. In a TFT array substrate of a liquid crystal device, a signal input terminal, and terminals are arranged along a substrate side, and a signal input line extends from the signal input terminal to a substrate side. Of constant potential lines that supply constant potential to an electrostatic protection circuit for the signal input line, a low potential line does not at all intersect the signal input line, and a high potential line, though intersecting the signal input line, does not intersect a wiring portion from the signal input terminal to the electrostatic protection circuit. Accordingly, even when a surge voltage enters from the signal input terminal, heat generation is not caused at an intersection between the signal input line and the low potential line by surge voltage.

15 Claims, 26 Drawing Sheets

(A)

(B)

SEMICONDUCTOR DEVICE, ELECTRO-OPTIC DEVICE, AND ELECTRONIC INSTRUMENT

BACKGROUND OF THE INVENTION

1. Field of the Invention

The present invention relates to a semiconductor device, an electro-optic device in which the semiconductor device is used as a transistor array substrate, and an electronic instrument in which the electro-optic device is used.

2. Description of Related Art

Currently, of various kinds of electro-optic devices, such as an active matrix type liquid crystal device that uses a thin film transistor (TFT) as a pixel switching non-linear element, are used in various kinds of electronic instruments, such as direct view display devices and projection display devices. In the electro-optic device, between a TFT array substrate (transistor array substrate/semiconductor device) on which pixel switching TFTs and pixel electrodes are formed in matrix corresponding to positions where data lines intersect scanning lines and an opposite substrate thereon an opposite electrode is formed, a liquid crystal as an electro-optic material is retained. Furthermore, on the TFT array substrate, in some cases, various kinds of driving circuits are formed by use of complementary TFTs.

Furthermore, as shown in FIGS. 24 through 26, on the TFT array substrate, an electrostatic protection circuit that protects a driving circuit or the like from a surge voltage caused by static electricity is formed.

FIG. 24 is an equivalent circuit diagram showing a layout of an electrostatic protection circuit and the surroundings thereof in a TFT array substrate that is used in an existing liquid crystal device. FIG. 25 is a plan view showing a layout of an electrostatic protection circuit and the surroundings thereof in a TFT array substrate that is used in an existing liquid crystal device. FIG. 26 is a cross sectional view taken when a TFT that forms and electrostatic protection circuit and intersections of wirings are cut by a D–D' line, a D1–D1' line and a D2–D2' line of FIG. 25 in a TFT array substrate that is used in an existing liquid crystal device.

As shown in FIGS. 24 through 26, in a TFT array substrate 10, along a substrate side 111, a signal input terminal 670 receives various kinds of signals that are supplied from the outside, a terminal 710 receives a high potential VDDX that is supplied from the outside, and a terminal 720 receives a low potential VSSX that is supplied from the outside are arranged. From these terminals 670, 710 and 720, a signal input line 67, a high potential line 71 and a low potential line 72, respectively, are extended up to a data line driving circuit 101. Furthermore, to the middle of the signal input line 67 an electrostatic protection circuit 5 is electrically connected, and in the electrostatic protection circuit 5, in order that a p-channel TFT 80 and a n-channel TFT 90 each may work as a normally-off diode, a gate electrode 65 and a source region 82 are fixed at a high potential VDDX, and a gate electrode 66 and a source region 92 are fixed at a low potential VSSX.

The high potential line 71 extends in a direction that intersects the signal input line 67 at a region more toward a substrate side 112 than a region where the signal input terminal 670 and the electrostatic protection circuit 5 are formed, and extends therefrom to a source region 82 of the p-channel TFT 80 of the electrostatic protection circuit 5. On the other hand, the low voltage line 72 goes through between a region where the signal input terminal 670 is formed and a region where the electrostatic protection circuit 5 is formed and extends toward a direction that intersects the signal input line 67, and extends therefrom to the electrostatic protection circuit 5.

In the above, since each of the wirings is formed in a multi-layered wiring structure, even when intersecting the others, between layers of the respective wirings an interlayer insulating film 4 is interposed. In other words, while body portions of the high potential line 71, the low potential line 72 and the signal input line 67 are formed of wirings on a top layer side than the interlayer insulating film 4, these body portions are partially intercepted at intersection portions 672, 717 and 729, and an electrical connection at the intercepted portions is established by going through a substrate wiring 3c in the same layer with the gate electrodes 65 and 66, and contact holes 718 and 719.

In the TFT array substrate 10 thus configured, even when a surge voltage due to static electricity enters from the signal input terminal 670, the surge voltage is expected to be absorbed by the electrostatic protection circuit 5 before entering the data line driving circuit 101. However, in the existing TFT array substrate 10, in the middle portion from the signal input terminal 670 to the electrostatic protection circuit 5, an intersection portion 729 between the signal input line 67 and the low potential line 72 is present. Accordingly, there can be a problem in that when a surge voltage enters from the signal input terminal 670, owing to the surge voltage, the intersection portion 729 between the signal input line 67 and the low potential line 72 is heated, and because of Joule heat thereof the signal input line 67 or the low potential line 72 is disconnected.

SUMMARY OF THE INVENTION

In view of the above problems, the present invention intends to provide a semiconductor device that does not cause problems at an intersection portion of wirings even when a surge voltage enters from an signal input terminal, an electro-optic device provided with the semiconductor device as a TFT array substrate, and an electronic instrument.

In order to overcome the problems, in the present invention, a constant potential line that supplies a constant potential to the electrostatic protection circuit is formed, while avoiding at least a region that intersects a wiring portion from the predetermined signal input terminal to the electrostatic protection circuit. This is provided in a semiconductor device that includes, on a substrate, a plurality of signal input terminals, a plurality of signal input lines extended from each of the plurality of the signal input terminals, and an electrostatic protection circuit that electrically connects to an intermediate position of a predetermined signal input line of the signal input lines.

In other words, in the present invention, when the plurality of signal input terminals are arranged along a first substrate side of the substrate, the plurality of signal input lines extend from each of the plurality of signal input terminals toward a second substrate side opposite to the first substrate side in the substrate, and the electrostatic protection circuit is disposed between the signal input lines. Furthermore, even when a terminal that connects to the constant potential line is also arranged along the first substrate side, the constant potential line for supplying a constant potential to the electrostatic protection circuit is allowed to intersect the signal input line in a portion that is more distant than the electrostatic protection circuit in the signal input line when seen from the signal input terminal, but the constant potential line is formed so as not to intersect a middle portion from the signal input terminal to the electrostatic protection circuit. As a result, even when a surge voltage enters from the signal input terminal, the surge voltage does not generate heat at an intersection portion between the signal input line and the constant potential line. Accordingly, problems such that the signal input line or the constant potential line is disconnected can be avoided from occurring. Furthermore, even when the surge voltage enters from the signal input terminal, since the surge voltage does not punch through an interlayer insulating film to the constant potential line, an interlayer short circuit can be prohibited. Accordingly, reliability of the semiconductor device can be improved.

In the present invention, when the constant potential line for supplying a constant potential to the electrostatic protection circuit is formed so as to avoid at least a region that intersects a wiring portion from the predetermined signal input terminal to the electrostatic protection circuit, for instance, the constant potential line is routed through a region more toward the first substrate side or a region more toward the second substrate side than a region where the signal input terminal and the electrostatic protection circuit are formed, and is extended therefrom to the electrostatic protection circuit.

In some cases, the constant potential line is formed of a high potential line that supplies a high potential to the electrostatic protection circuit and a low potential line that supplies a low potential to the electrostatic protection circuit. In such cases, one of the low potential line and the high potential line is preferably routed through a region more toward the second substrate side than a region where the signal input terminal and the electrostatic protection circuit are formed and is extended therefrom to the electrostatic protection circuit. On the other hand, the other constant potential line is preferably routed through a region more toward the first substrate side than a region where the signal input terminal and the electrostatic protection circuit are formed, and is extended therefrom to the electrostatic protection circuit. When thus configured, there is no need of expanding a terminal pitch or the like in a first substrate side direction. Furthermore, although the other constant potential line is formed at a region more toward the first substrate side than a region where the signal input terminal and the electrostatic protection circuit are formed, when compared with an existing configuration, only a position of the other constant potential line is changed, accordingly there is no need of expanding the surrounding of a terminal formation region.

In addition, in the present invention, in the case of the constant potential line being formed of a high potential line that supplies a high potential to the electrostatic protection circuit and a low potential line that supplies a low potential to the electrostatic protection circuit, both the low potential line and the high potential line may be routed through a region more toward the first substrate side or the second substrate side than a region where the signal input terminal and the electrostatic protection circuit are formed, and may be extended therefrom to the electrostatic protection circuit.

In the present invention, in the electrostatic protection circuit, for instance, a TFT whose gate and source are fixed at a constant potential so as to be a normally off state can be used.

Furthermore, in the electrostatic protection circuit, a plurality of TFTs that are connected in series in a state where the gate and the source are fixed at a constant potential so as to be a normally off state may be used. In this case, in the electrostatic protection circuit, by configuring the TFT in a dual gate structure or a triple gate structure, a plurality of TFTs may be connected in series. When thus configured, a withstand voltage of the TFT can be improved.

In the present invention, in the electrostatic protection circuit, a first conductivity type TFT and a second conductivity type TFT that are connected in series in a state where the gate and the source are fixed at a constant potential so as to be a normally off state may be used.

Furthermore, in the present invention, in the electrostatic protection circuit, a plurality of TFTs that are connected in parallel in a state where the gate and the source are fixed at a constant potential so as to be a normally off state may be used. When thus configured, since an on-current of the TFT can be made larger, the electrostatic protection circuit can be assuredly operated.

In the present invention, the TFT is preferably provided with a LDD structure. Such a configuration can be suitably used in a normally off state, since a leakage current when the TFT is off can be made smaller.

A semiconductor device of the present invention can be applied, for instance, in an electro-optic device, that is formed as a transistor array substrate and that holds an electro-optic material. In this case, the signal input line extends to a driving circuit that drives pixels formed in matrix on the transistor array substrate.

In the present invention, when the transistor array substrate and an opposite substrate disposed opposite to the transistor array substrate are disposed so as to hold a liquid crystal as the electro-optic material therebetween, an electro-optic device can be configured as a liquid crystal device.

An electro-optic device of the present invention can be applied in various kinds of electronic instruments, such as projection display devices, direct view display devices and the like.

BRIEF DESCRIPTION OF THE DRAWINGS

The invention will be described with reference to the accompanying drawings, wherein like numerals reference like elements, and wherein.

Figure 21:
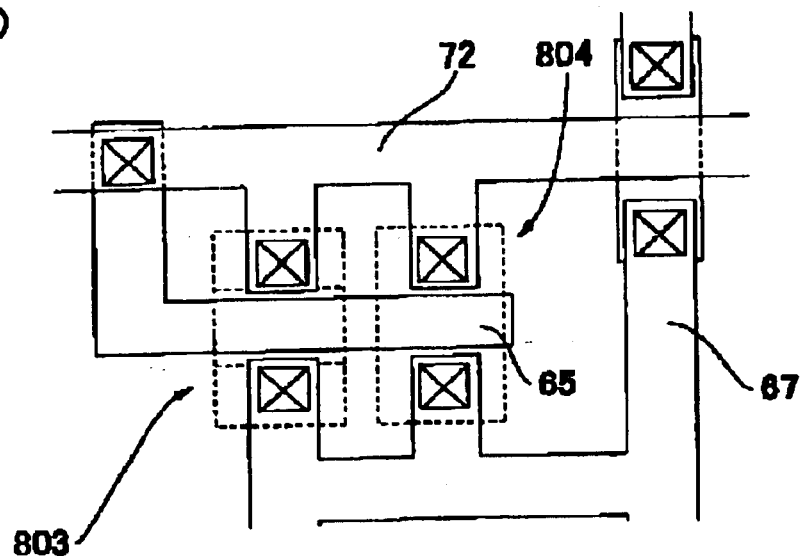
Figure 21:
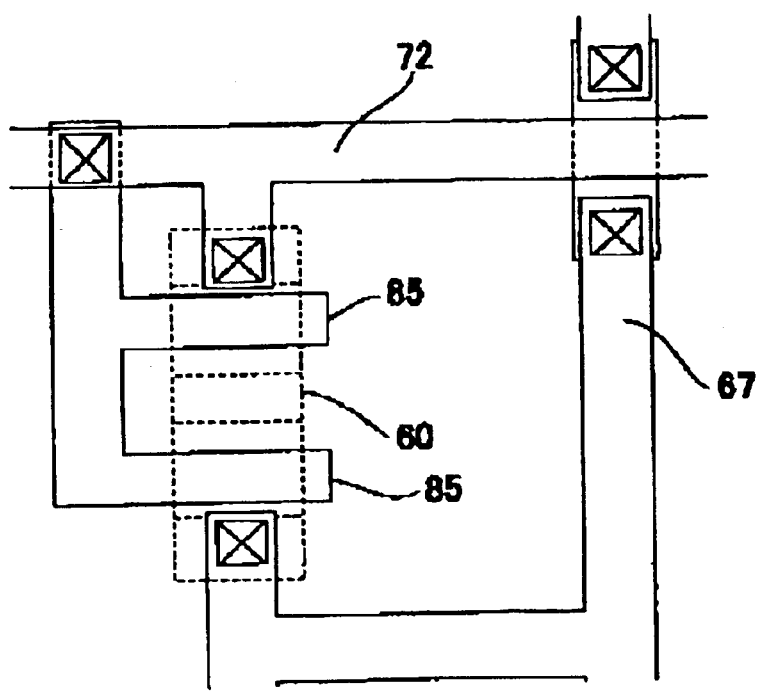
Figure 22:
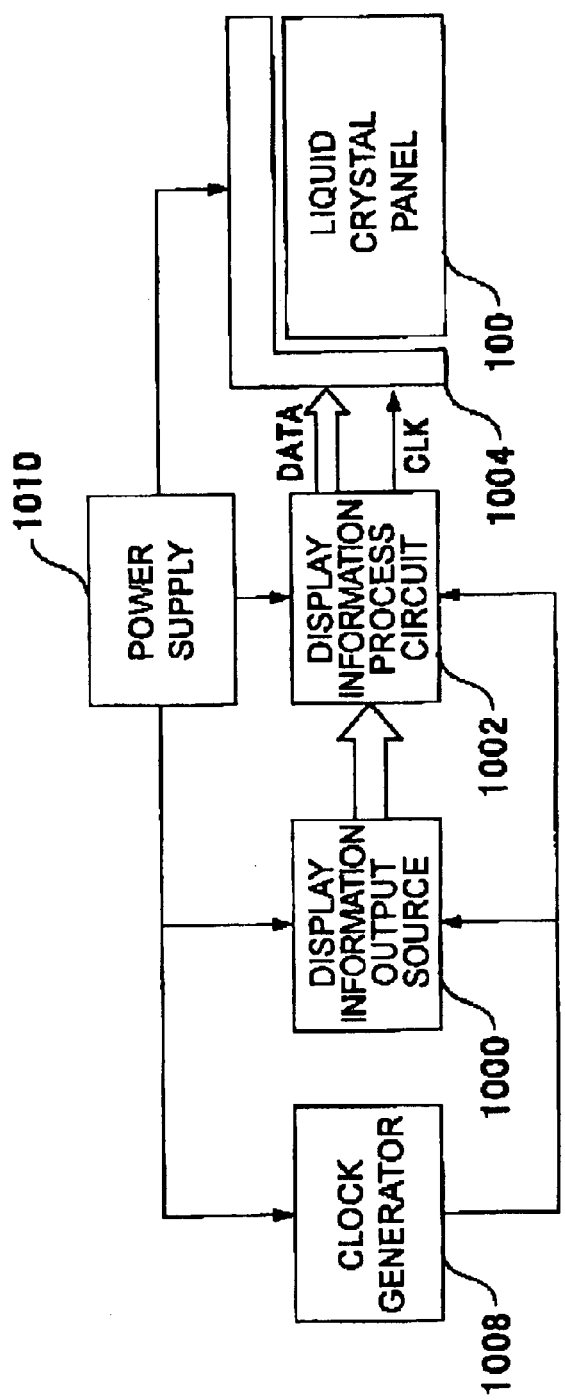
Figure 23:
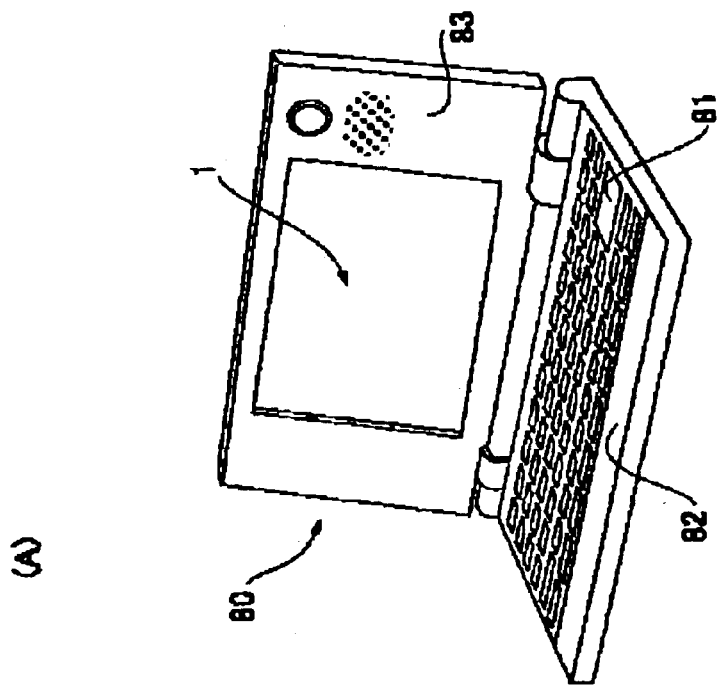
Figure 23:
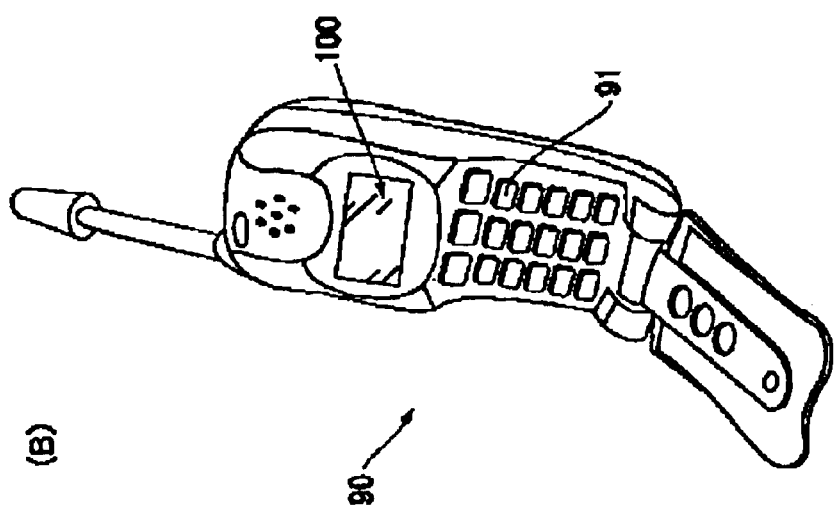
Figure 24:
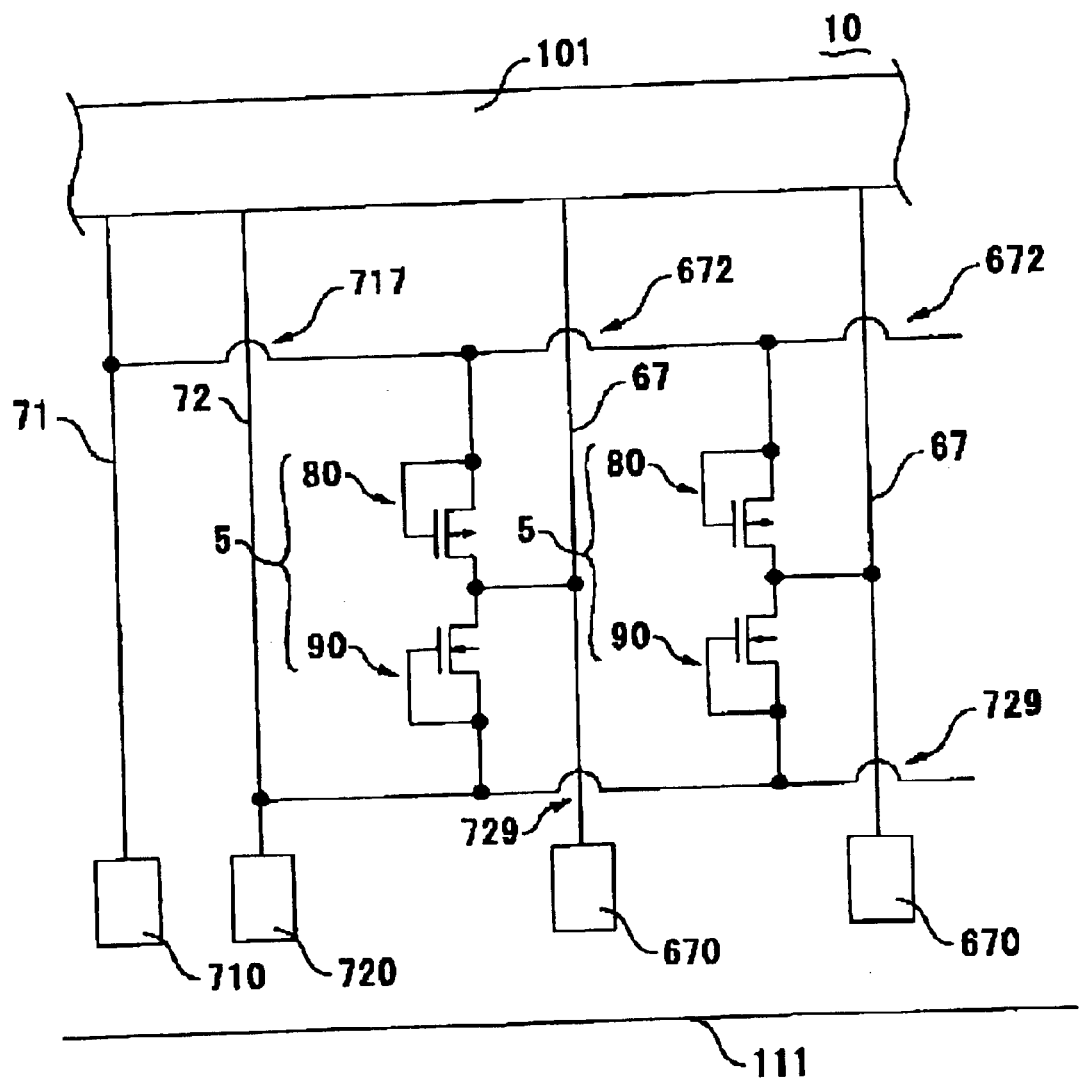
Figure 25:
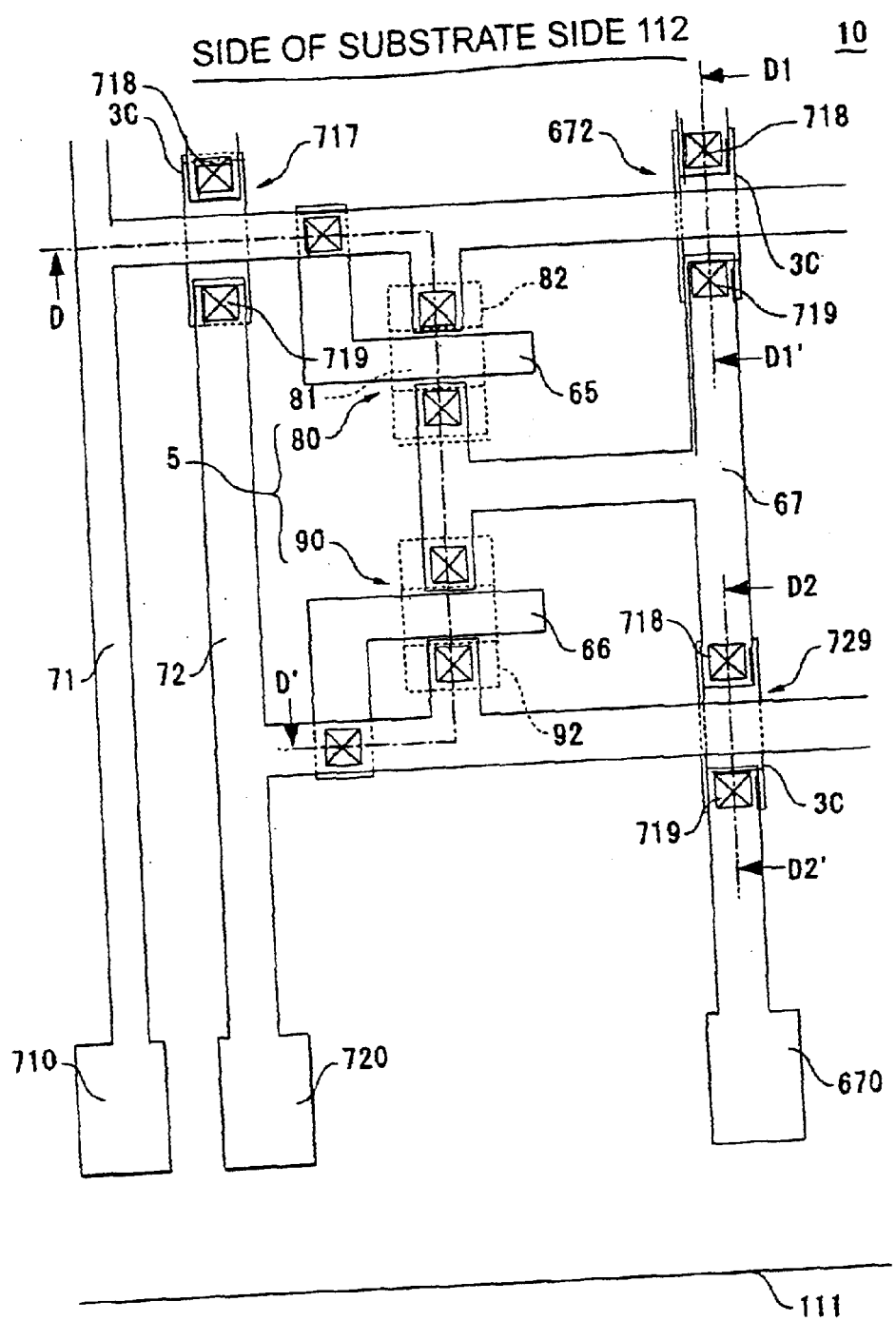
Figure 26:
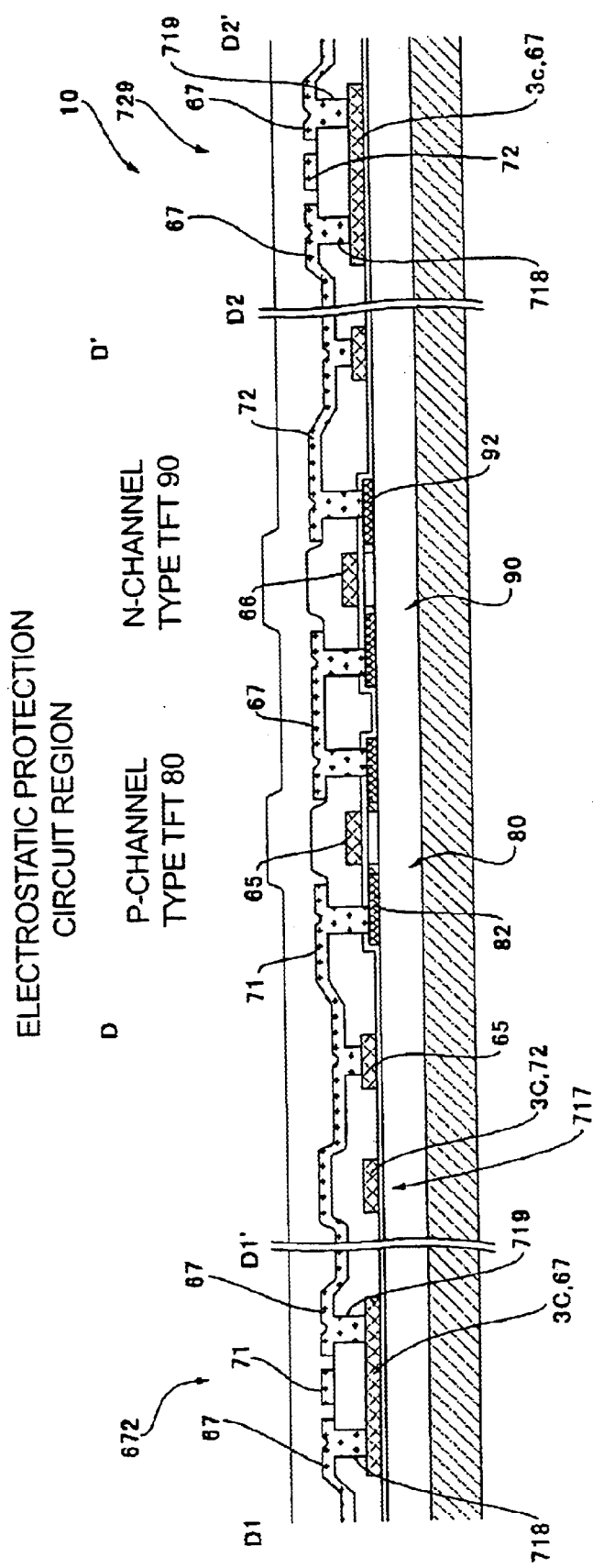

Each of FIGS. 21(A) and 21(B) is an explanatory diagram of a TFT that is used for configuring an electrostatic protection circuit in the TFT array substrate used in a liquid crystal device thereto the present invention is applied;

FIG. 22 is a block diagram showing a circuit configuration of an electronic instrument in which a liquid crystal device according to the present invention is applied;

FIGS. 23(A) and 23(B), respectively, are an explanatory diagram of a mobile type personal computer and an explanatory diagram of a portable telephone as examples of electronic instruments in which a liquid crystal device according to the present invention is used;

FIG. 24 is an equivalent circuit diagram showing an electrostatic protection circuit and a layout of the surroundings thereof in a TFT array substrate that is used in an existing liquid crystal device;

FIG. 25 is a plan view showing an electrostatic protection circuit and a layout of the surroundings thereof in a TFT array substrate that is used in an existing liquid crystal device; and FIG. 26 is a cross sectional view when in a TFT array substrate that is used in an existing liquid crystal device, a TFT that constitutes an electrostatic protection circuit and intersections of wirings are cut by a D–D' line, a D1–D1' line and a D2–D2' line of FIG. 25.

DETAILED DESCRIPTION OF PREFERRED EMBODIMENTS

In the following, with reference to the drawings, the present mode for carrying out the invention will be explained. In the following explanation, as a semiconductor device thereto the present invention is applied, a TFT array substrate (transistor array substrate) of an active matrix type liquid crystal device (electro-optic device) will be explained.

Figure 1:
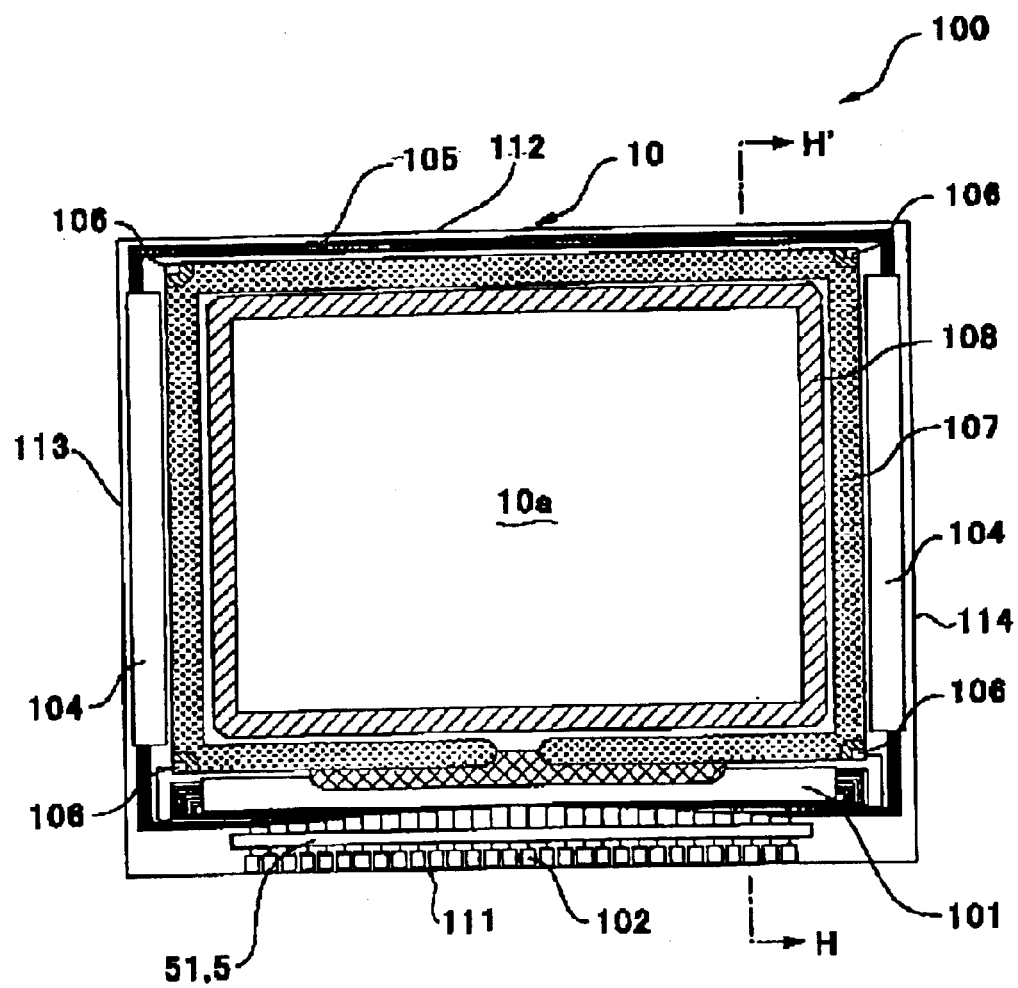
FIG. 1 is a plan view when a liquid crystal device thereto the present invention is applied and the respective constituents formed thereon are seen together from a side of an opposite substrate.
Figure 2:
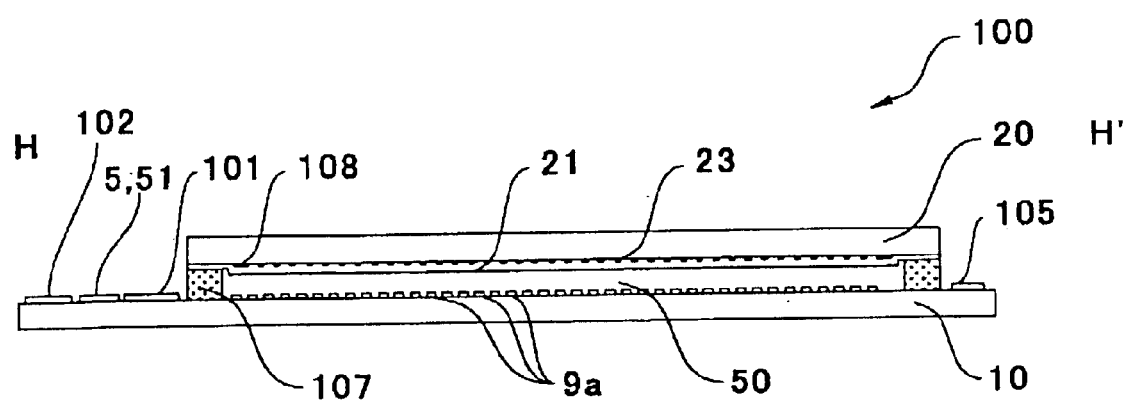
FIG. 2 is a cross sectional view at H–H' line of FIG. 1.

FIG. 1 is a plan view in which a liquid crystal device, together with the respective constituents formed thereon, is seen from a side of an opposite substrate. FIG. 2 is and H–H' cross sectional view of FIG. 1 showing including the opposite substrate.

In FIG. 1, on a TFT array substrate 10 (semiconductor device) of a liquid crystal device 100 (electro-optic device), a sealant 107 is disposed so as to follow an edge of an opposite substrate to be adhered. In a region outside of the sealant 107, a data line driving circuit 101 and terminals 102 are formed along a substrate side 111 (first substrate side) of the TFT array substrate 10, and scanning line driving circuits 104 are formed along two substrate sides 113 and 114 adjacent to the substrate side 111.

Furthermore, between the terminals 102 and the data line driving circuit 101, a formation region 51 of an electrostatic protection circuit 5, described below, is secured.

When a delay of a scanning signal supplied to a scanning line does not cause any problem, needless to say, the scanning line driving circuit 104 may be disposed only on one side. Furthermore, the data line driving circuit 01 may be disposed on both sides along sides of an image display region 10a. For instance, data lines of an odd number sequence may supply image signals from the data line driving circuit disposed along one side of the image display region 10a, and data lines of an even number sequence may supply image signals from the data line driving circuit disposed along a side on an opposite side of the image display region 10a. When the data lines are driven in a comb-teeth manner like this, a formation area of the data line driving circuit 101 can be expanded, thus a complicated circuit can be constituted.

Furthermore, in the TFT array substrate 10, in a substrate side 112 (second substrate side) opposite to the substrate side 111, a plurality of wirings 105 that connect between the scanning line driving circuits 104 disposed on both sides of the image display region 10a a disposed, and still furthermore, in some cases, by use of a region that overlaps with a frame 108, a precharge circuit and an inspection circuit are disposed. Furthermore, at one or more corner portions of the opposite substrate 20, a top/bottom conductive material 106 for electrical conductivity between the TFT array substrate 10 and the opposite substrate 20 is formed.

As shown in FIG. 2, the opposite substrate 20 that has a contour substantially similar to the sealant 107 shown in FIG. 1 is fixed to the TFT array substrate 10 with the sealant 107. The sealant 107 is an adhesive that can be made of a photosetting resin or a thermosetting resin and used to adhere the TFT array substrate 10 and the opposite substrate 20 at a periphery thereof. A gap material such as glass fiber or glass beads is compounded in the adhesive so as to determine a distance between the both substrates at a predetermined value.

As described in detail later, in the TFT array substrate 10, pixel electrodes 9a are formed in matrix. On the other hand, on the opposite substrate 20, in a region inside of the sealant 107, a frame 108 made of a light shielding material is formed. Furthermore, in the opposite substrate 20, in a region opposite to a matrix-like boundary regions of the pixel electrodes 9a formed on the TFT array substrate 10, a light shielding film 23 called black matrix or black stripe is formed, and on a top layer side thereof an opposite electrode 21 made of an ITO film is formed.

When the liquid crystal device 100 is used in, for instance, a projection display device (liquid crystal projector), three liquid crystal devices 100 are used as light valves for RGB respectively, and onto each of the liquid crystal devices 100, a light of a corresponding color separated by a dichroic mirror for use in RGB separation is entered as a projection light. Accordingly, in each of the liquid crystal devices 100 according to the above mode, a color filter is not formed. However, when in the opposite substrate 20, in a region opposite to each of the pixel electrodes 9a, a RGB color filter is formed together with a protection film thereof, the liquid crystal device 100 can be used as a color display device for electronic instruments, such as mobile computers, portable telephones, liquid crystal TVs and so on described later, as well as projection display devices.

Furthermore, when the opposite substrate 20 is provided with micro-lenses corresponding to each of the pixels, a light focusing efficiency of an incident light on the pixel electrode 9a can be increased, accordingly brighter display can be realized. Still furthermore, when many interference layers of different refractive indices are laminated on the opposite substrate 20, by use of an interference action of a light, a dichroic filter that generates RGB colors may be formed. By using the opposite substrate with the dichroic filter, further brighter color display can be performed.

In the next place, a configuration and an operation of a TFT array substrate 10 and an active matrix type liquid crystal device 100 will be explained with reference to FIGS. 3 and 4.

Figure 3:
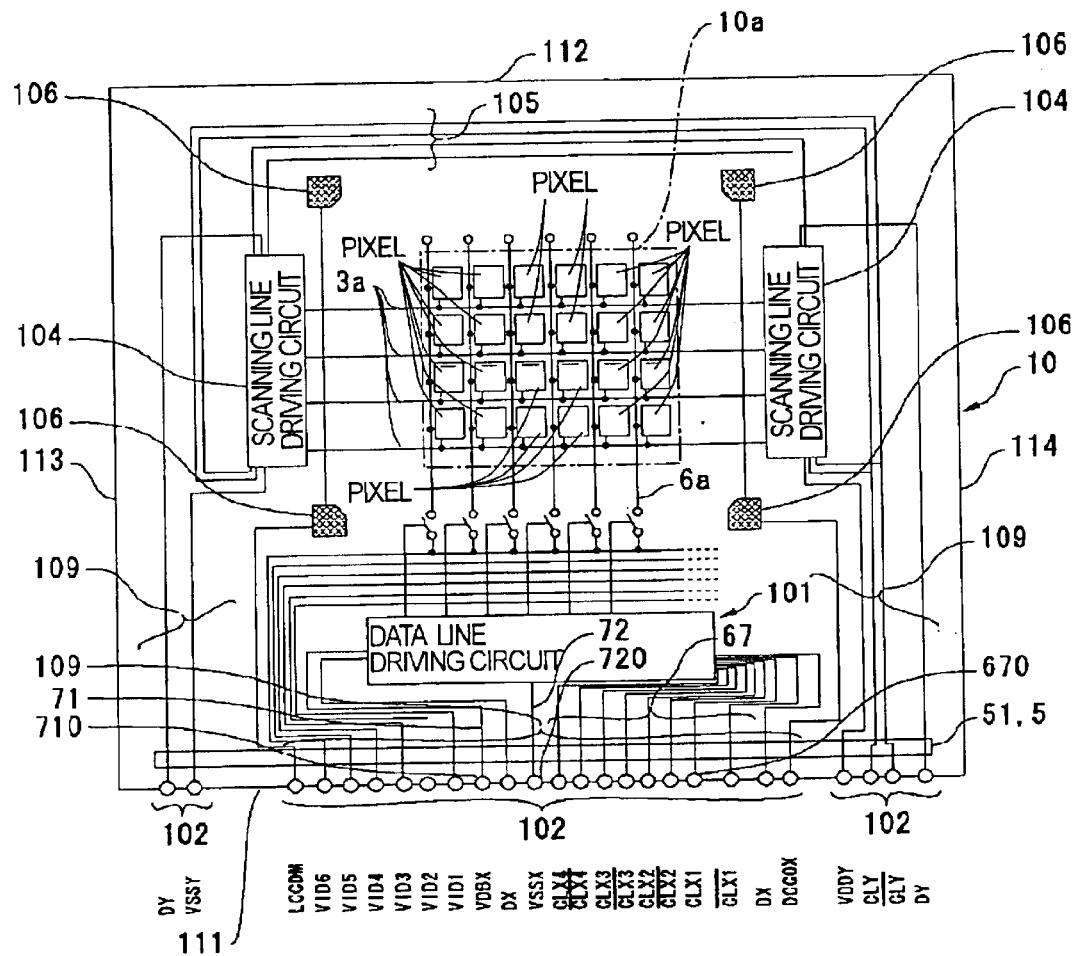
FIG. 3 is a block diagram schematically showing a TFT array substrate with a built-in driving circuit that is used in the liquid crystal device shown in FIGS. 1 and 2.
Figure 4:
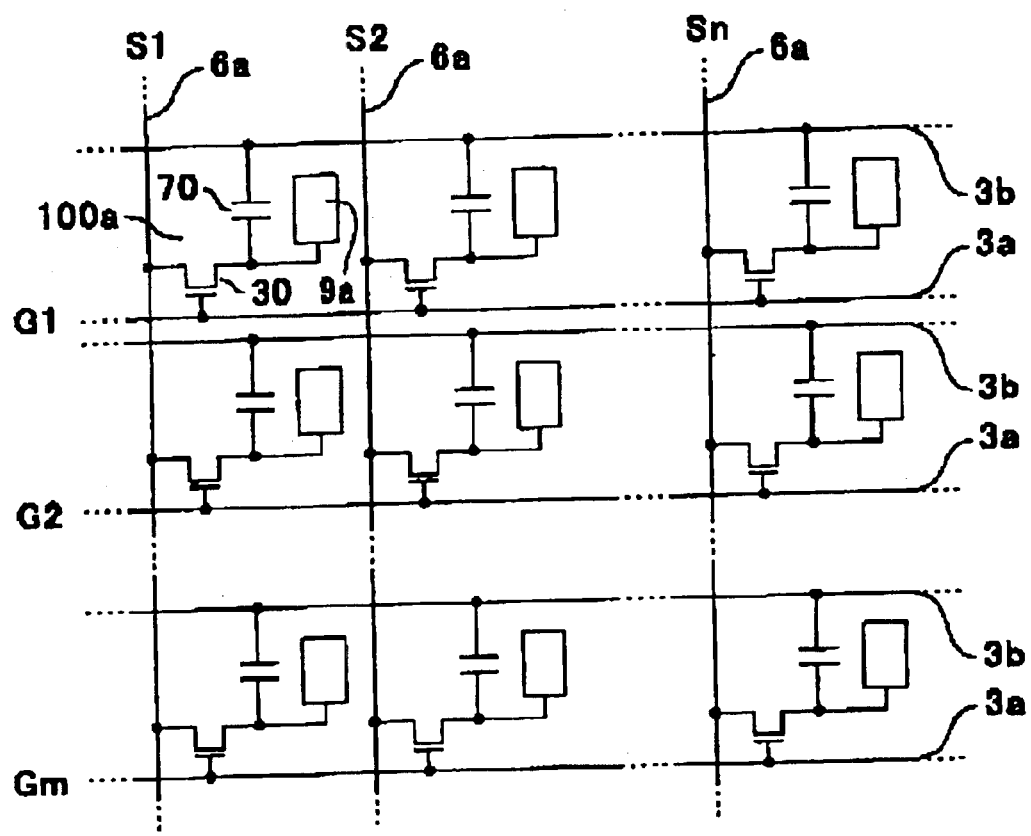
FIG. 4 is an equivalent circuit diagram of various kinds of elements and wirings in a plurality of pixels formed in matrix so as to configure an image display region in the liquid crystal device shown in FIGS. 1 and 2.
Figure 5:
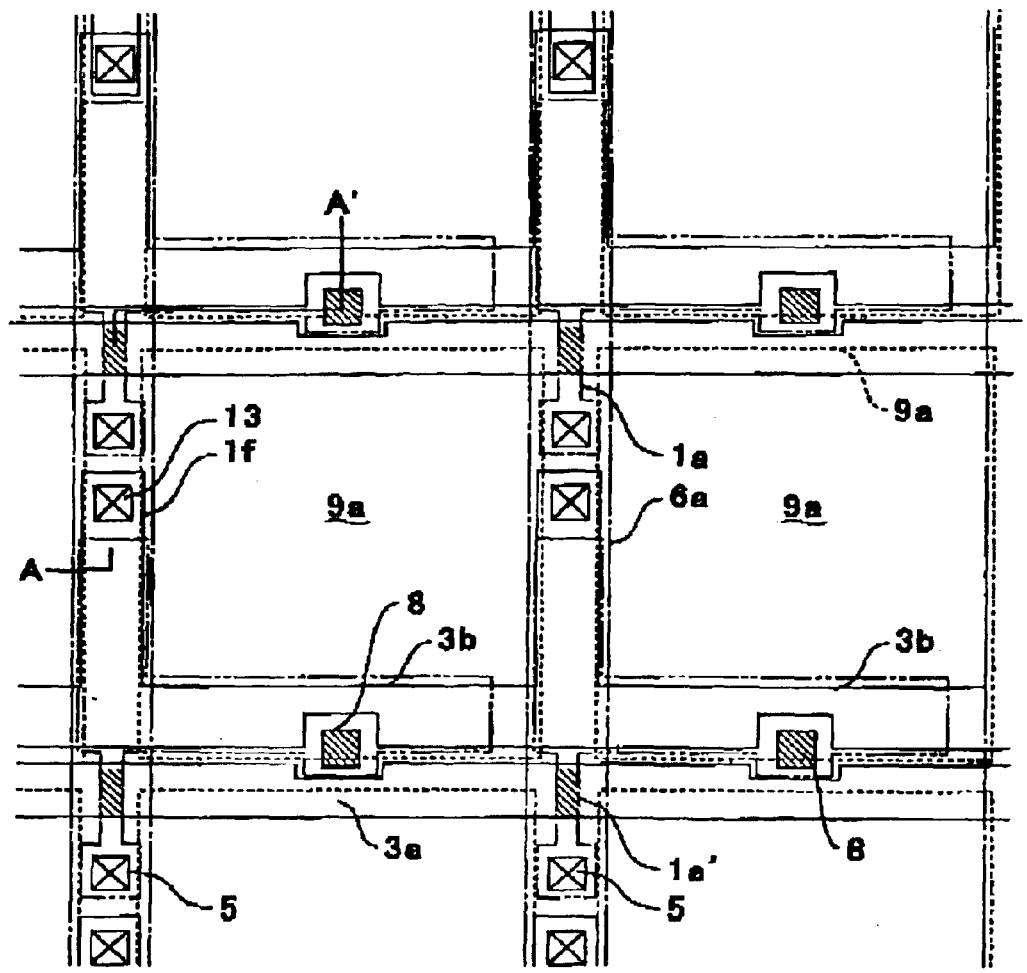
FIG. 5 is a plan view of adjacent pixels in a TFT array substrate thereon a data line, a scanning line, a pixel electrode and so on are formed in the liquid crystal device shown in FIGS. 1 and 2.
Figure 6:
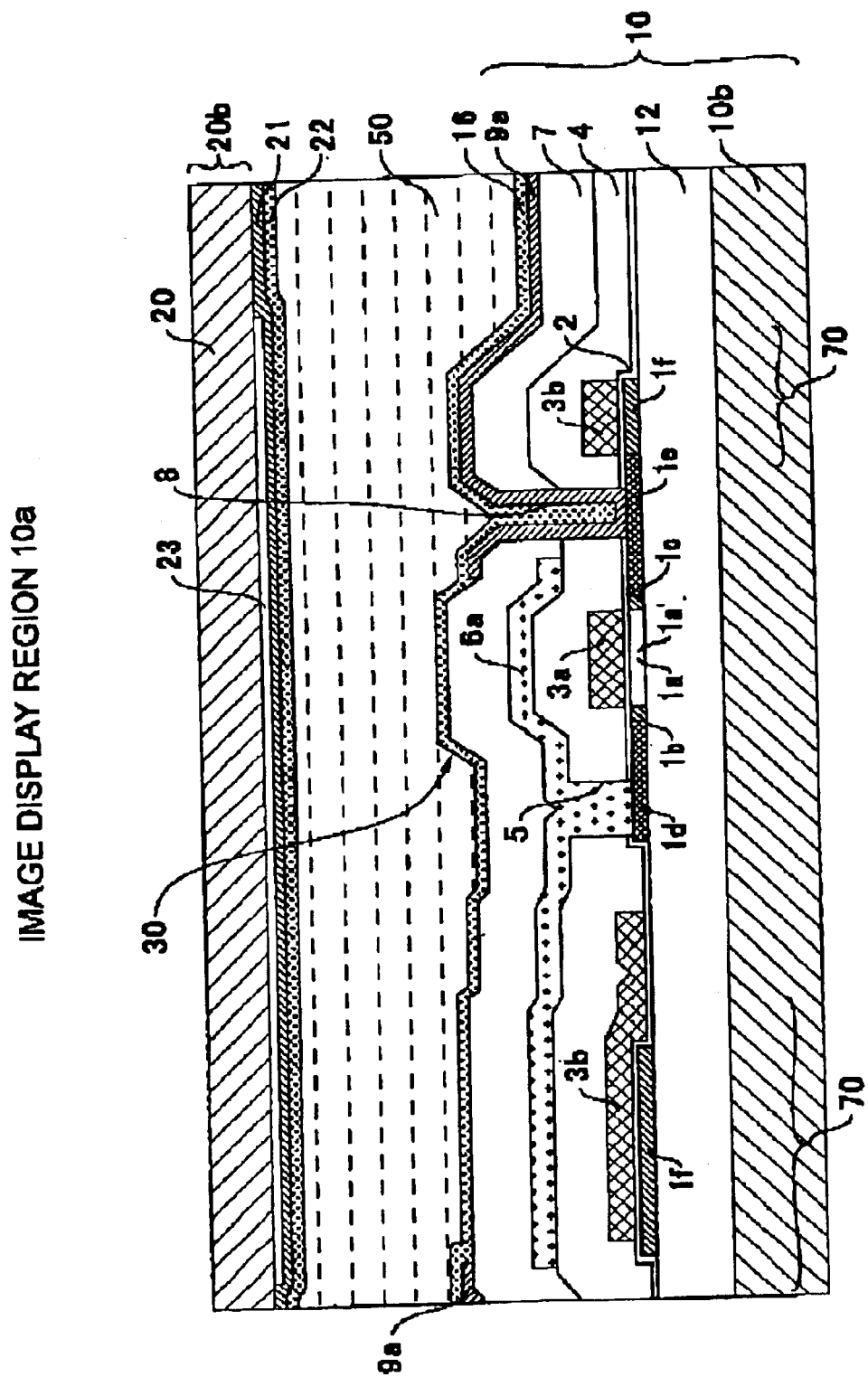
FIG. 6 is a cross sectional view when part of an image display region of the liquid crystal device shown in FIGS. 1 and 2 is cut at a position corresponding to an A–A' line of FIG. 5.

FIG. 3 is an exemplary block diagram schematically showing a configuration of a TFT array substrate 10 with a built-in driving circuit used in a liquid crystal device 100, and FIG. 4 is an equivalent circuit diagram of various kinds of elements and wirings in a plurality of pixels formed in matrix to form an image display region 10a in the liquid crystal device 100. FIG. 5 is a plan view of adjacent pixels in the TFT array substrate thereon data lines, scanning lines and pixel electrodes are formed. FIG. 6 is an explanatory drawing showing a cross section at a position corresponding to an A–A' line of FIG. 5 and a cross section when a liquid crystal as an electro-optic material is sealed in between the TFT array substrate and the opposite substrate. In the above drawings and drawings to be described below, in order to make each of layers and members perceptible in the drawings, scales are differentiated for each of layers and members.

As shown in FIG. 3, in a TFT array substrate 1 with a built-in driving circuit, on an insulating substrate 10b, corresponding to intersections of a plurality of data lines 6a and a plurality of scanning lines 3a, a plurality of pixels 100a are arranged in matrix. Furthermore, in a data line driving circuit 101, an X side shift resistor, a sample hold circuit S/H provided with a TFT as an analog switch that operates based on a signal outputted from the X side shift resistor, and six image signal lines video corresponding to each of image signals VD1 through VD6 developed into six phases are formed. In the present example, in the data line driving circuit 101, the X side shift resistor is formed in four phases, and from outside through terminals 102, a start signal DX, clock signals CLX1 through CLX4, and inverted clock signals thereof $\overline{CLX1}$ through $\overline{CLX4}$ are supplied to the X side shift resistor, and with the signals the data line driving circuit 101 is driven. Accordingly, in the sample hold circuit S/H, each of the TFTs operates based on a signal outputted from the X side shift resistor, and thereby the sample hold circuit S/H can take in the image signals VD1 through VD6 supplied through the image signal lines video into the data line 6a at predetermined timings and can supply these to each of pixels 100a. On the other hand, in the scanning line driving circuit 104, a start signal DY, a clock signal CLY and an inverted clock signal thereof $\overline{CLY}$ are supplied from the outside through the terminals 102, and with the signals the scanning line driving circuit 104 is driven.

In the TFT array substrate 10 according to the present mode, along the substrate side 111, a lot of terminals 102 made of a conductive film, such as a metal film such as an aluminum film, a metal silicide film, or an ITO film are formed, and thereto constant power supplies VDDX, VSSX, VDDY, VSSY, modulated image signals (image signals VD1 through VD6), and various kinds of driving signals are input. From these terminals 102, a plurality of signal wirings 109 made of a metal film of low resistance, such as an aluminum film or a metal silicide film, are routed to drive the scanning line driving circuit 01 and the data line driving circuit 104, respectively.

Between the terminals 102 and the data line driving circuit 101, a formation region 51 of an electrostatic protection circuit 5, described below, is secured. As the electrostatic protection circuit 5 being formed here, in the present mode, a configuration for protecting the data line driving circuit 01 from a surge voltage will be described later as an example. In the configuration, even when a surge voltage caused by static electricity enters the signal input terminals 670 (which receives input of clock signals CLX1 through CLX4 and inverted clock signals thereof $\overline{CLX1}$ through $\overline{CLX4}$ are input) and the signal input lines 67, which are the terminals 102 and wirings 109, the surge voltage is allowed to escape to a high potential line 71 thereto a high potential VDDX is supplied through the terminal 710, or to a low potential line 72 thereto the low potential VSSX is supplied from the outside through the terminal 720, and thereby the data line driving circuit 01 can be protected from the surge voltage.

As shown in FIG. 4, in an image display region 10a of a liquid crystal device 100, in each of a plurality of pixels 100a arranged in matrix, a pixel electrode 9a and a pixel switching TFT 30 for controlling the pixel electrode 9a are formed, and a data line 6a that supplies an image signal is electrically connected to a source of the TFT 30. Pixel signals S1, S2, . . . Sn to be written in the data line 6a are line sequentially supplied in this order. Furthermore, a scanning line 3a is electrically connected to a gate of the TFT 30, and at predetermined timings, scanning signals G1, G2 . . . Gm are, in this order and in pulse, supplied line sequentially to the scanning line 3a. The pixel electrode 9a is electrically connected to a drain of the TFT 30, and when the TFT 30 that is a switching element is kept in an on-state for a definite duration, the pixel signals S1, S2, . . . Sn supplied from the data line 6a are written into the corresponding pixels at predetermined timings. The pixel signals S1, S2, . . . Sn that are written into a liquid crystal through the pixel electrode 9a and have a predetermined level are retained for a definite time period between the pixel electrode and an opposite electrode formed on the opposite substrate described later.

In order to hinder the retained pixel signals from leaking, in some cases, in parallel with a liquid crystal capacitance formed between the pixel electrode 9a and the opposite electrode, a storage capacitance 70 (capacitor) is added. By adding the storage capacitance 70, for instance, a voltage-retained time of the pixel electrode 9a is 9 thousand times longer than the time of a source voltage is applied. Thereby, the electric charge retention characteristics are improved, resulting in realizing a liquid crystal device capable of displaying with a high contrast ratio. As a method for forming the storage capacitance 70, the storage capacitance 70 may be formed with a capacitor line 3b that is wiring for forming a capacitance or may be formed with a scanning line 3a in a preceding stage.

In FIG. 5, on the TFT array substrate 10 of the liquid crystal device 100, a transparent pixel electrode 9a (region surrounded by a dotted line) is formed for each of a plurality of pixels arranged in matrix, along lengthwise and crosswise boundary regions of the pixel electrode 9a, a data line 6a (shown with a dashed line), a scanning line 3a (shown with a solid line), and a capacitance line 3b (shown with a solid line) are formed.

As shown in FIG. 6, a base of the TFT array substrate 10 is made of a transparent substrate 10b, such as a quartz substrate or a heat resistant glassy plate, and a base of the opposite substrate 20 is made of a transparent substrate 20b, such as a quartz substrate or a heat resistant glassy plate. On the TFT array substrate 10, a pixel electrode 9a is formed, and on an upper side thereof an orientation film 16 made of a polyimide film or the like thereto a predetermined orientation process, such as a rubbing process or the like is applied is formed. The pixel electrode 9a is made of a transparent conductive film such as an ITO (Indium Tin Oxide) film or the like. Furthermore, the orientation film 16 can be formed by applying the rubbing process to an organic film, such as a polyimide film or the like. In the opposite substrate 20, also on an upper layer side of the opposite electrode 21, an orientation film 22 made of a polyimide film is formed, and the orientation film 22 is also a polyimide film thereto the rubbing process is applied.

In the TFT array substrate 10, on a surface of the transparent substrate 10b, a substrate protection film 12 is formed and on a surface side thereof, in the image display region 10a, at a position adjacent to each of the pixel electrodes 9a, a pixel switching TFT 30 that controls switching of each of the pixel electrodes 9a is formed.

As shown in FIGS. 5 and 6, the pixel switching TFT 30 has an LDD (Lightly Doped Drain) structure, and in a semiconductor film 1a, a channel region 1a' in which a channel is formed by an electric field from the scanning line 3a, a low concentration source region 1b, a low concentration drain region 1c, a high concentration source region 1d and a high concentration drain region 1e are formed. Furthermore, on an upper layer side of the semiconductor film 1a, a gate insulating film 2 that isolates the semiconductor film 1a from the scanning line 3a is formed.

On an upper layer side of thus configured TFT 30, interlayer insulating films 4, 7 made of a silicon oxide film are formed. On a surface of the interlayer insulating film 4, a data line 6a is formed, and the data line 6a is electrically connected to the high concentration source region 1d through a contact hole 5 formed in the interlayer insulating film 4. On a surface of the interlayer insulating film 7, the pixel electrode 9a made of an ITO film is formed. The pixel electrode 9a is electrically connected to the high concentration drain region 1e through a contact hole 8 formed in the interlayer insulating films 4, 7 and the gate insulating film 2. On a surface side of the pixel electrode 9a, an orientation film 16 made of a polyimide film is formed.

Furthermore, a capacitance line 3b in the same layer with the scanning line 3a, as a top electrode, faces to an extension portion 1f (bottom electrode) extended from the high concentration drain region 1e through an insulating film (dielectric film) formed simultaneously with the gate insulating film 2, and thereby a storage capacitance 70 is formed.

Although the TFT 30 preferably has the LDD structure as mentioned above, it may have an offset structure in which impurity ion-implantation is not implemented to regions corresponding to the low concentration source region 1b and the low concentration drain region 1c. Furthermore, the TFT 30 may be a self-alignment type TFT in which an impurity ion is implanted at a high concentration level with the gate electrode (part of the scanning line 3a) as a mask, thereby a source and drain region of high concentration being formed in a self-alignment manner. Furthermore, although in the present mode a single gate structure in which only one gate electrode (scanning line 3a) of the TFT 30 is disposed between the source and drain regions is adopted, two or more gate electrodes may be disposed therebetween. At this time, to the respective gate electrodes, the same signal is applied. When the TFT 30 is configured with a dual gate (double gate) or a triple gate or more like this, a leakage current at a connecting portion between the channel and the source-drain region can be inhibited, and thereby resulting in reducing an electric current at the off time. When at least one of the gate electrodes is formed into the LDD structure or the offset structure, an off current can be further reduced, resulting in realizing a stable switching element.

Thus configured TFT array substrate 10 and opposite substrate 20 are disposed so that the pixel electrode 9a may face the opposite electrode 21, and between the substrates a liquid crystal 50, as an electro-optic material, is filled in a space surrounded by the sealant 107 (FIGS. 1 and 2) and held there. The liquid crystal 50, in a state where an electric field from the pixel electrode 9a is not applied, takes on a predetermined orientation state due to the orientation film. The liquid crystal 50 is made of one in which, for instance, one or more kinds of nematic liquid crystals are mixed.

On a surface of a light incidence side or a light exit side of the opposite substrate 20 and the TFT array substrate 10, corresponding to the kind of the liquid crystal 50 being used, that is, operation modes such as TN (twisted nematic) mode and STN (super TN) mode, or normally white mode/normally black mode, a polarization film, a retardation film or a polarization plate is disposed in a predetermined direction.

Referring once more to FIG. 1, in the liquid crystal device 100 according to the present mode, of a front surface side of the TFT array substrate 10, by use of a region surrounding the image display region 10a, a data line driving circuit 101 and scanning line driving circuits 104 are formed. The data line driving circuit 101 and scanning line driving circuits 104 like this are basically formed of an n-channel TFT and a p-channel TFT shown in FIGS. 7 and 8.

Figure 7:
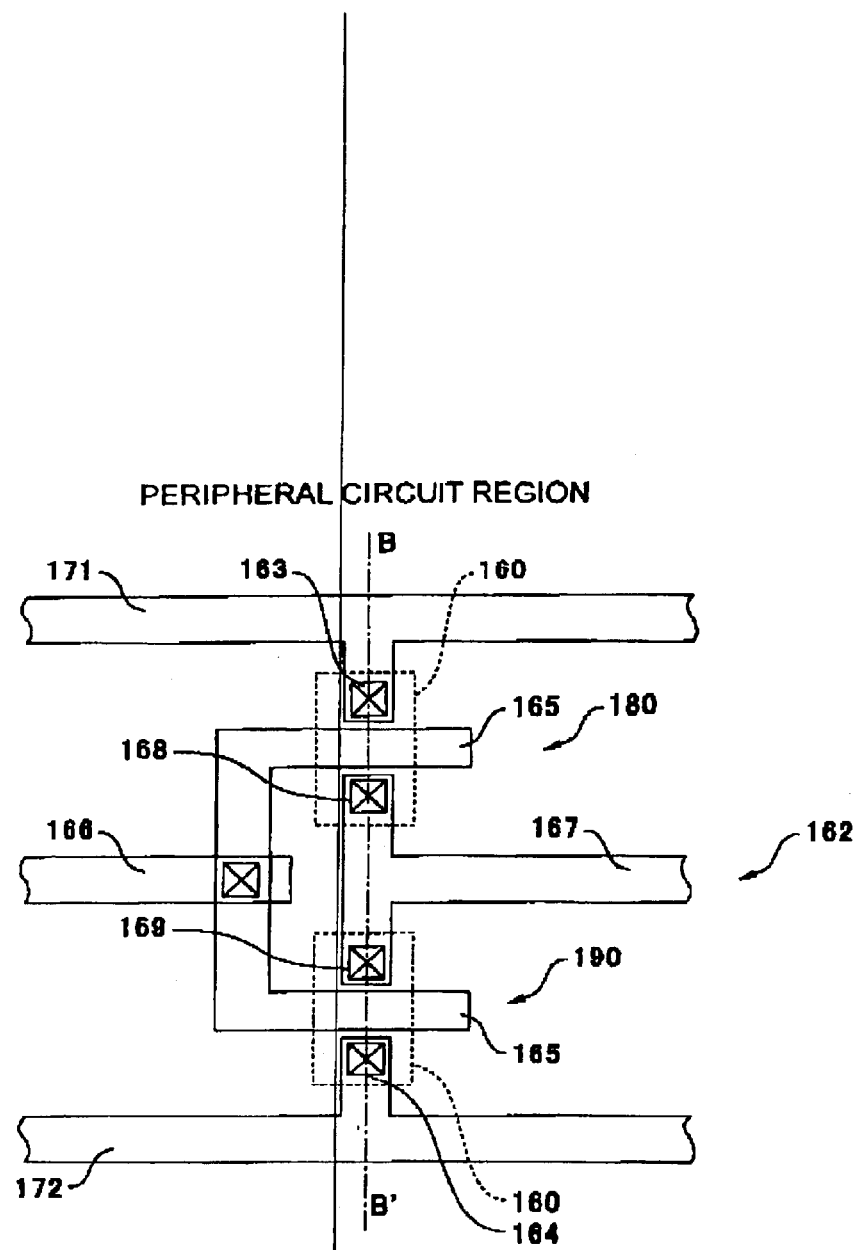
FIG. 7 is a plan view of a peripheral circuit formed in a periphery of an image display region of the liquid crystal device shown in FIGS. 1 and 2.
Figure 8:
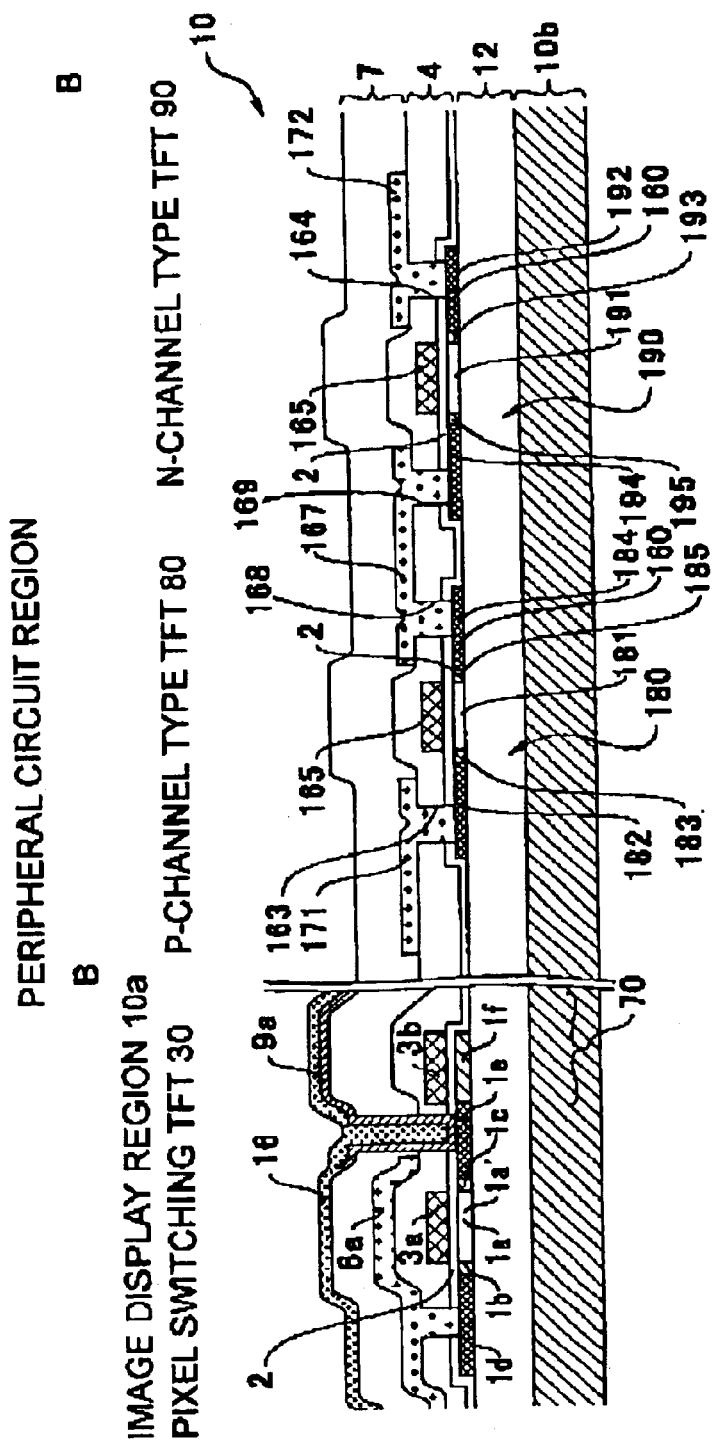
FIG. 8 is a cross sectional view of a TFT for use in driving circuit shown in FIG. 7.

FIG. 7 is a plan view showing a configuration of a TFT constituting a peripheral circuit, such as the scanning line driving circuits 104 and the data line driving circuit 101. FIG. 8 is a cross sectional view when the TFT constituting the peripheral circuit is cut by a B–B' line of FIG. 7.

In FIGS. 7 and 8, the TFT constituting the peripheral circuit is constituted as a complementary type TFT made of a p-channel TFT 180 and a n-channel TFT 190. Semiconductor films 160 (contour is shown with a dotted line) constituting the TFT 180 and the TFT 190 for use in driving circuit are formed island-like on a substrate protection film 12 formed on a substrate 10b.

In the TFTs 180, 190, a high potential line 171 and a low potential line 172, respectively, are electrically connected to corresponding source regions of the semiconductor film 160 through the contact holes 163 and 164. Furthermore, an input wiring 166 is connected to common gate electrodes 165, and an output wiring 167 is electrically connected to drain regions of the semiconductor film 160 through contact holes 168, 169.

Since the peripheral circuit region like this is also formed through a process similar to the image display region 10a, also in the peripheral circuit region, interlayer insulating films 4 and 7 and a gate insulating film 2 are formed. Furthermore, also the TFTs 180 and 190 for use in driving circuit, similarly to the pixel switching TFT 30, have the LDD structure, and on both sides of channel formation regions 181 and 191, a source region made of high concentration source regions 182 and 192 and low concentration source regions 183 and 193, and a drain region made of high concentration drain regions 184 and 194 and low concentration drain regions 185 and 195 are disposed.

Referring again to FIGS. 1 and 3, in the liquid crystal device 100 according to the present mode, on the TFT array substrate 10, a region 51 for forming an electrostatic protection circuit 5 is secured between the terminal 102 and the data line driving circuit 101. A configuration of the surroundings of the electrostatic protection circuit 5 will be explained with reference to FIGS. 9 through 11.

Figure 9:
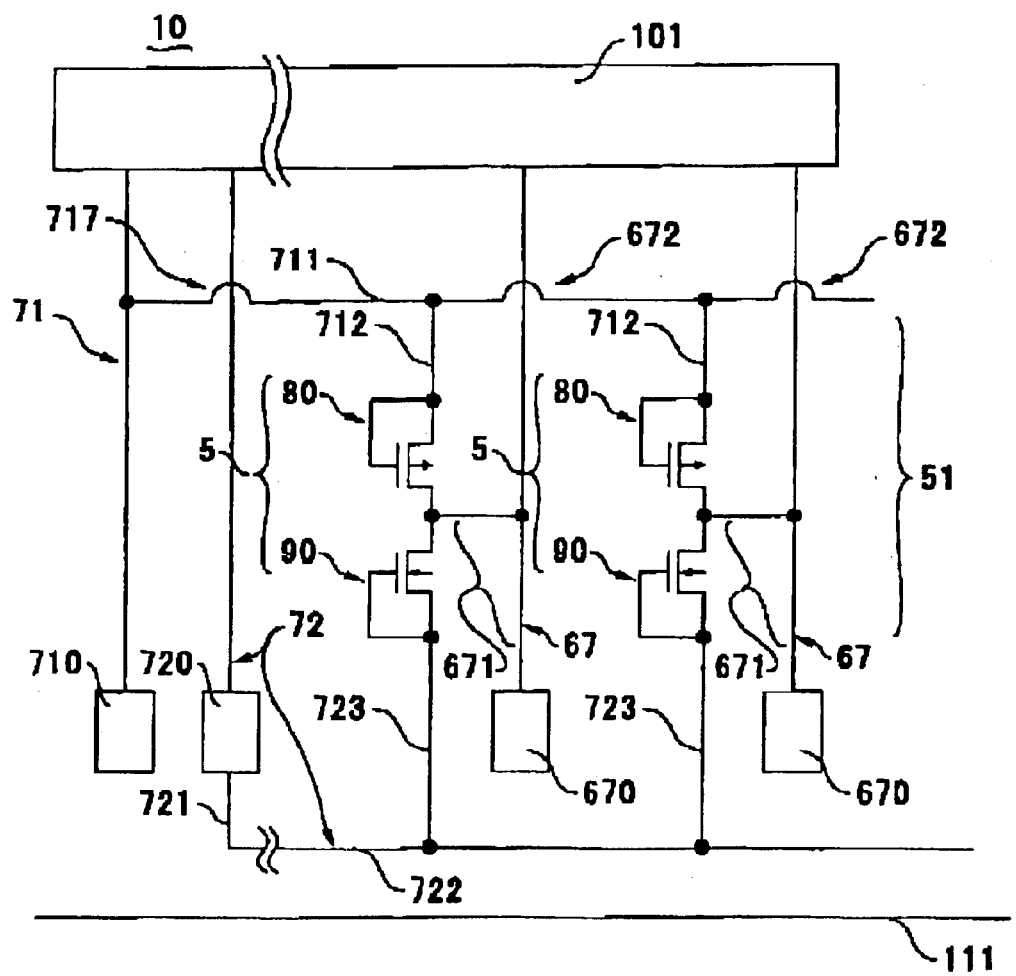
FIG. 9 is an equivalent circuit diagram showing a layout of an electrostatic protection circuit and the surroundings thereof in the TFT array substrate used in a liquid crystal device according to a mode for carrying out the invention 1 of the present invention.
Figure 10:
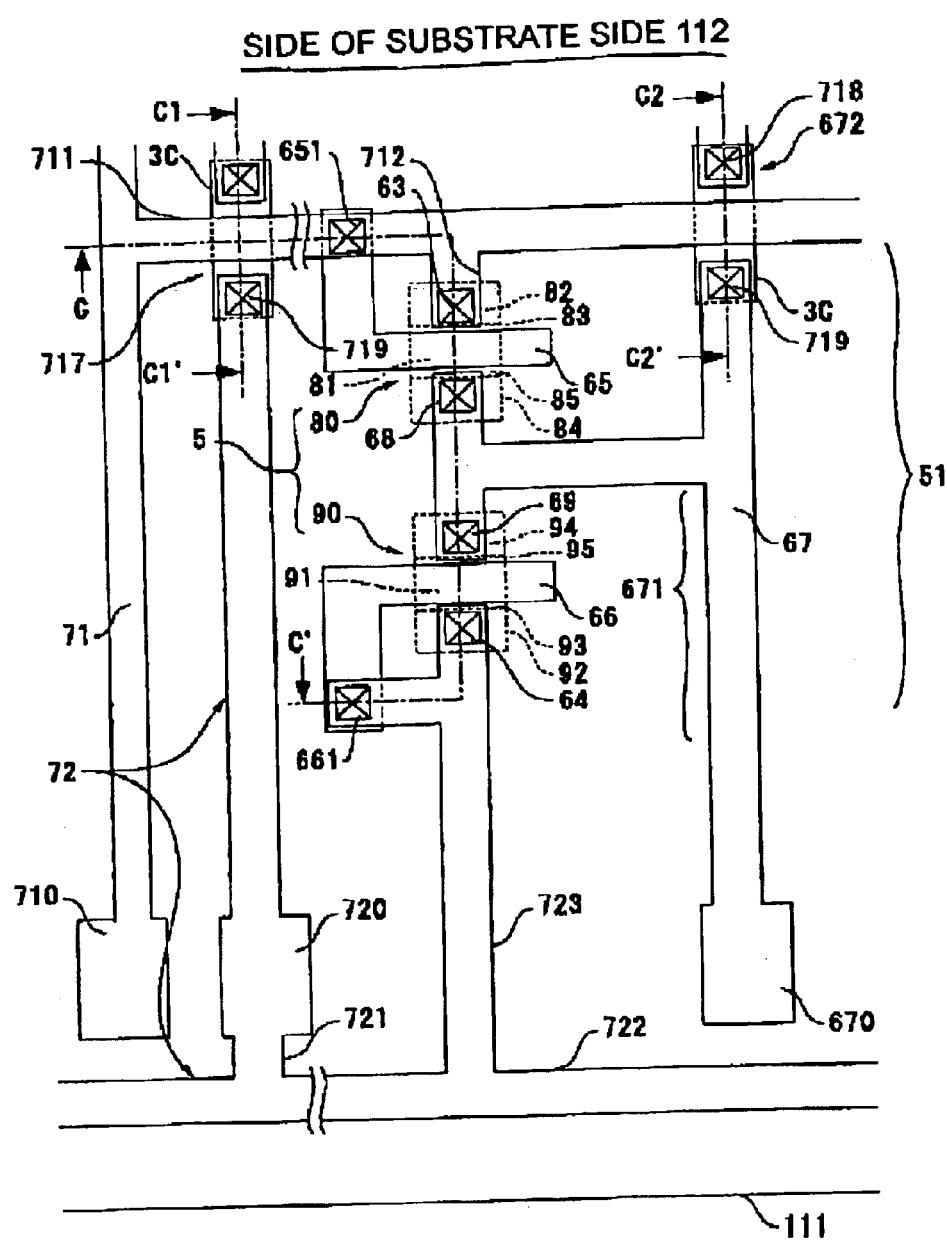
FIG. 10 is a plan view showing a layout of an electrostatic protection circuit and the surroundings thereof in the TFT array substrate used in a liquid crystal device according to a mode for carrying out the invention 1 of the present invention.
Figure 11:
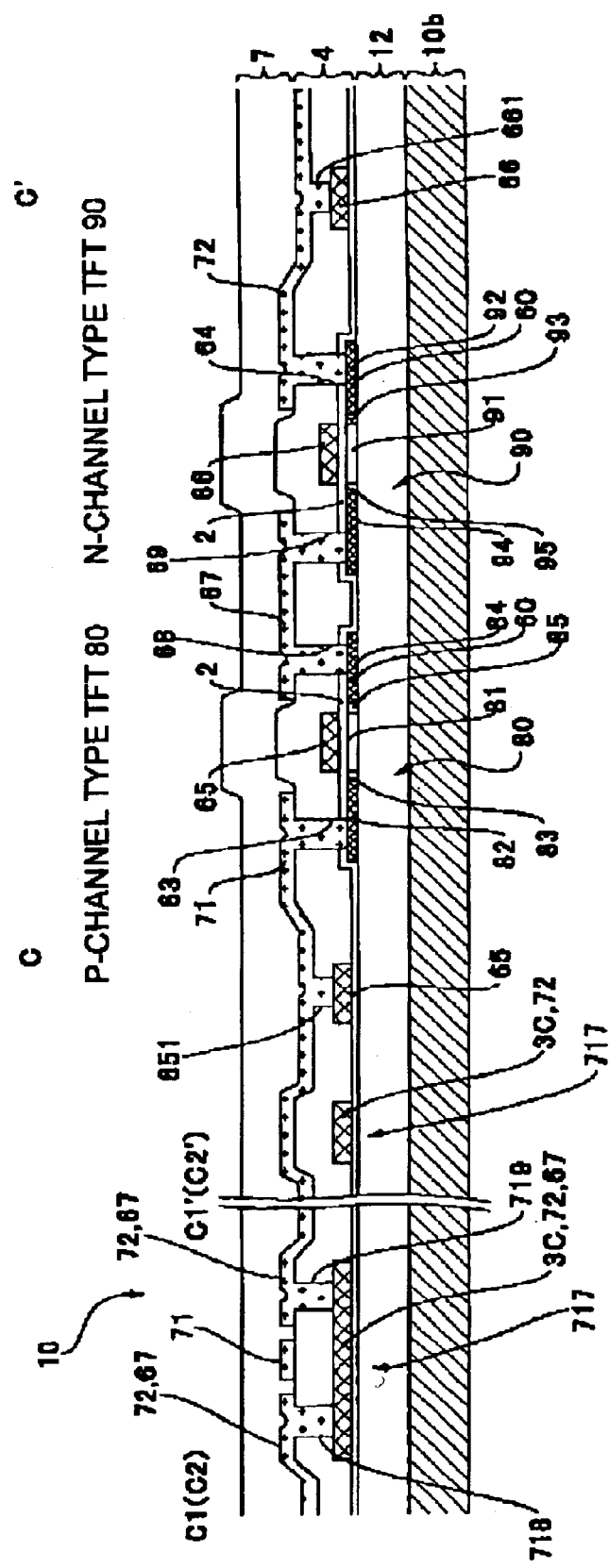
FIG. 11 is a cross sectional view when in the TFT array substrate that is used in the liquid crystal device according to the mode for carrying out the invention 1 of the present invention, the TFT that constitutes the electrostatic protection circuit and intersections of wirings are cut by a C–C' line, a C1–C1' line, and C2–C2' line of FIG. 10.
Figure 12:
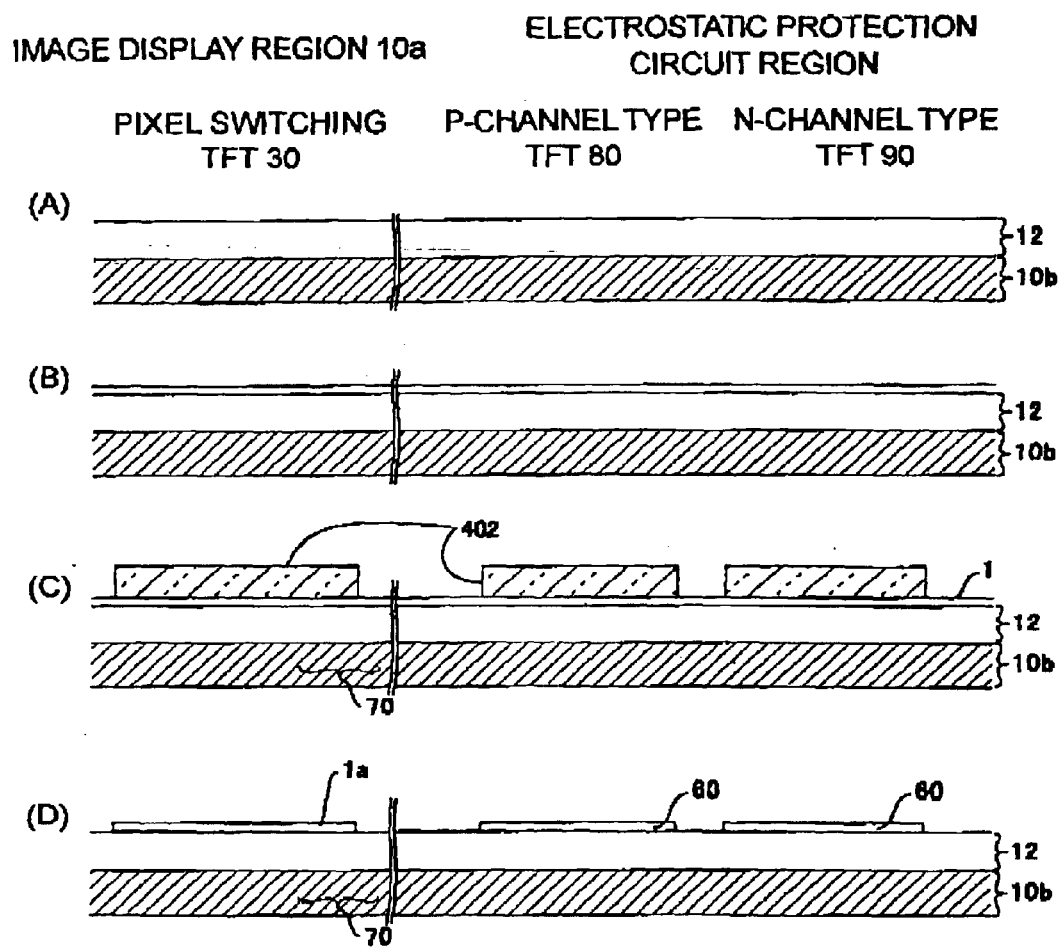
FIGS. 12(A) through 12(D) are cross sectional views of process showing a fabricating method of the TFT array substrate according to the mode for carrying out the invention 1 of present invention.
Figure 13:
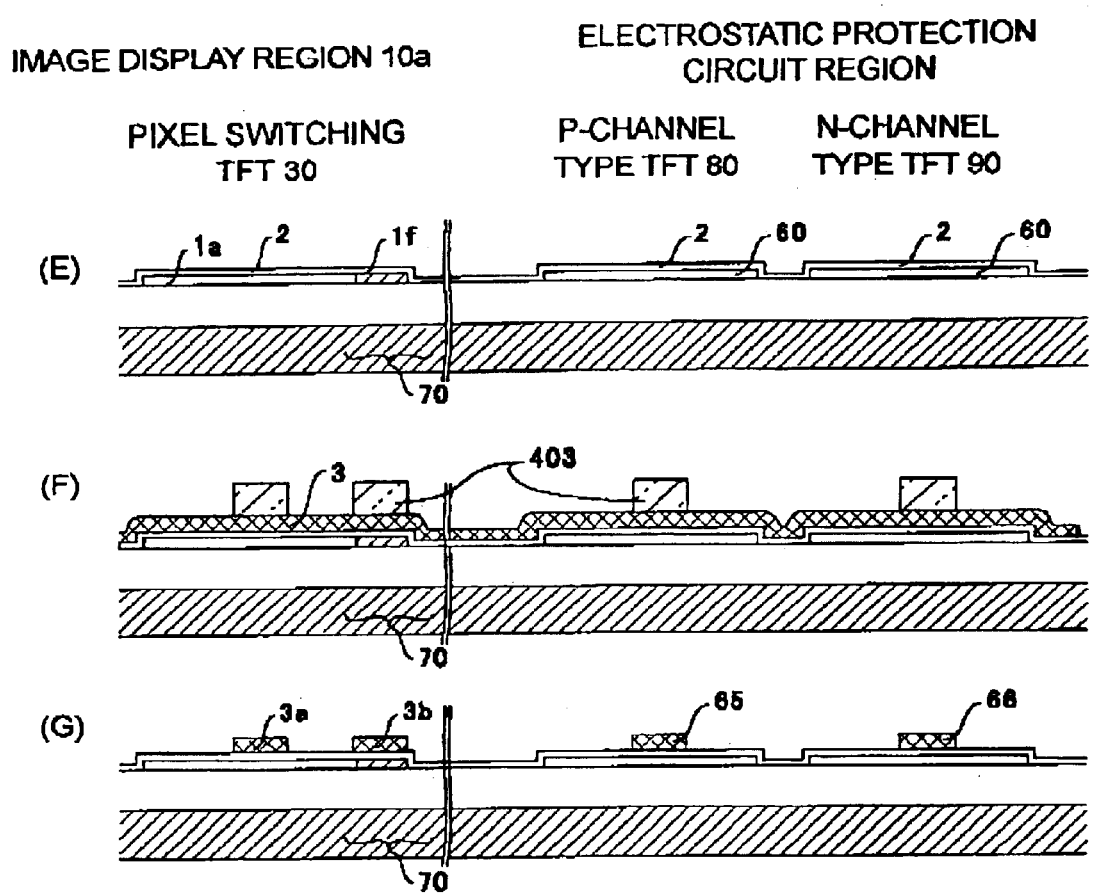
FIGS. 13(E) through 13(G) are cross sectional views of process showing a fabricating method of the TFT array substrate according to the mode for carrying out the invention 1 of present invention.
Figure 14:
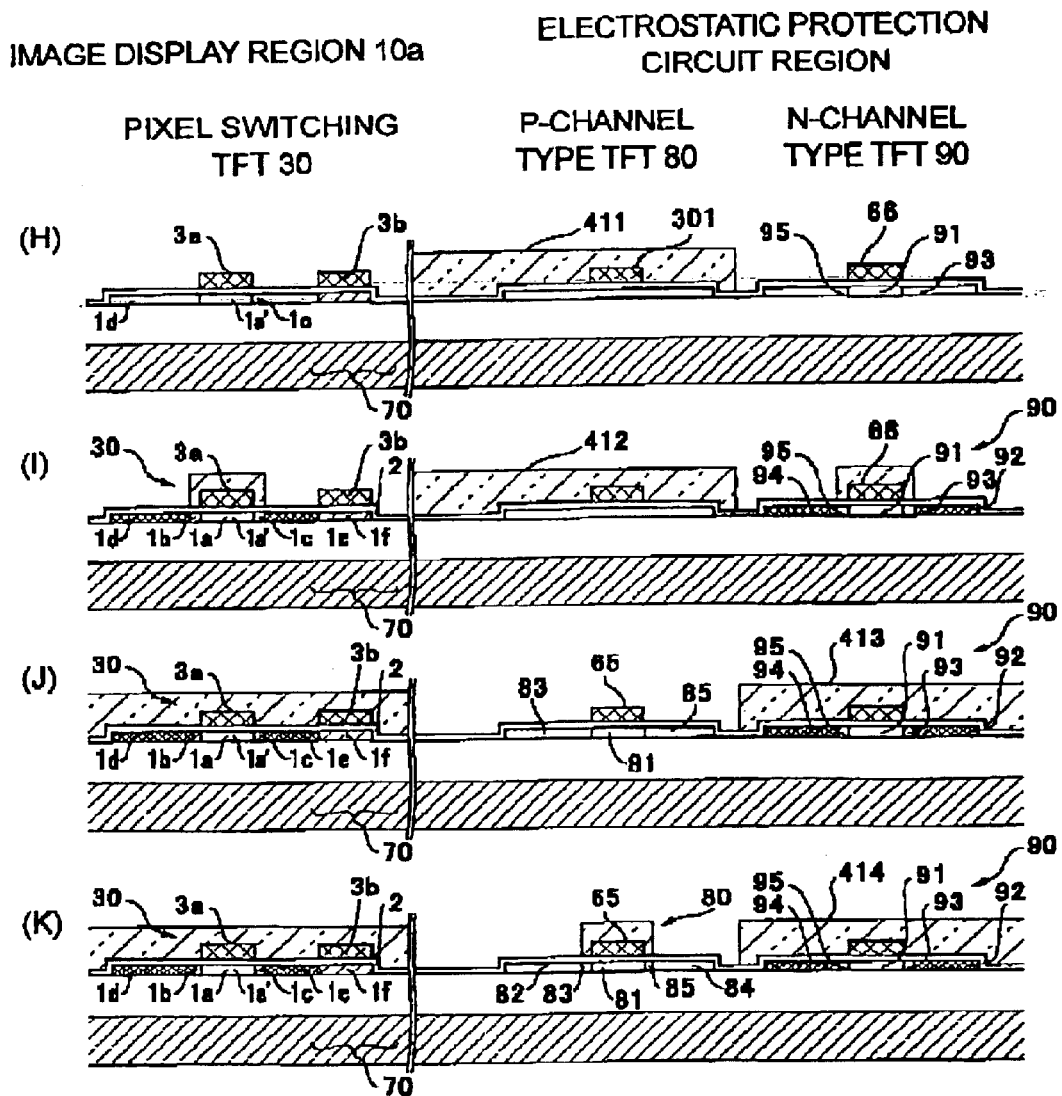
FIGS. 14(H) through 14(K) are cross sectional views of process showing a fabricating method of the TFT array substrate according to the mode for carrying out the invention 1 of present invention.
Figure 15:
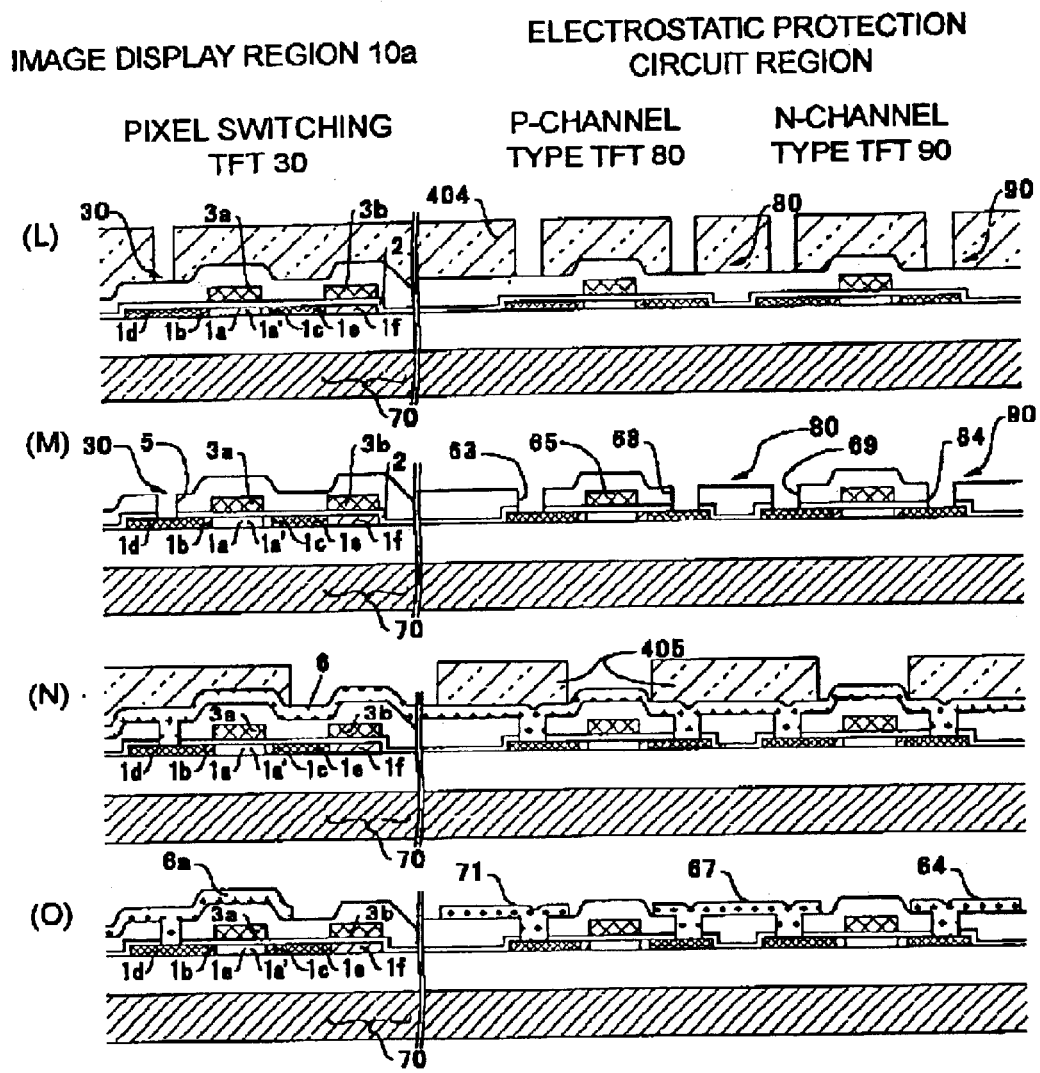
FIGS. 15(L) through 15(Q) are cross sectional views of process showing a fabricating method of the TFT array substrate according to the mode for carrying out the invention 1 of present invention.
Figure 16:
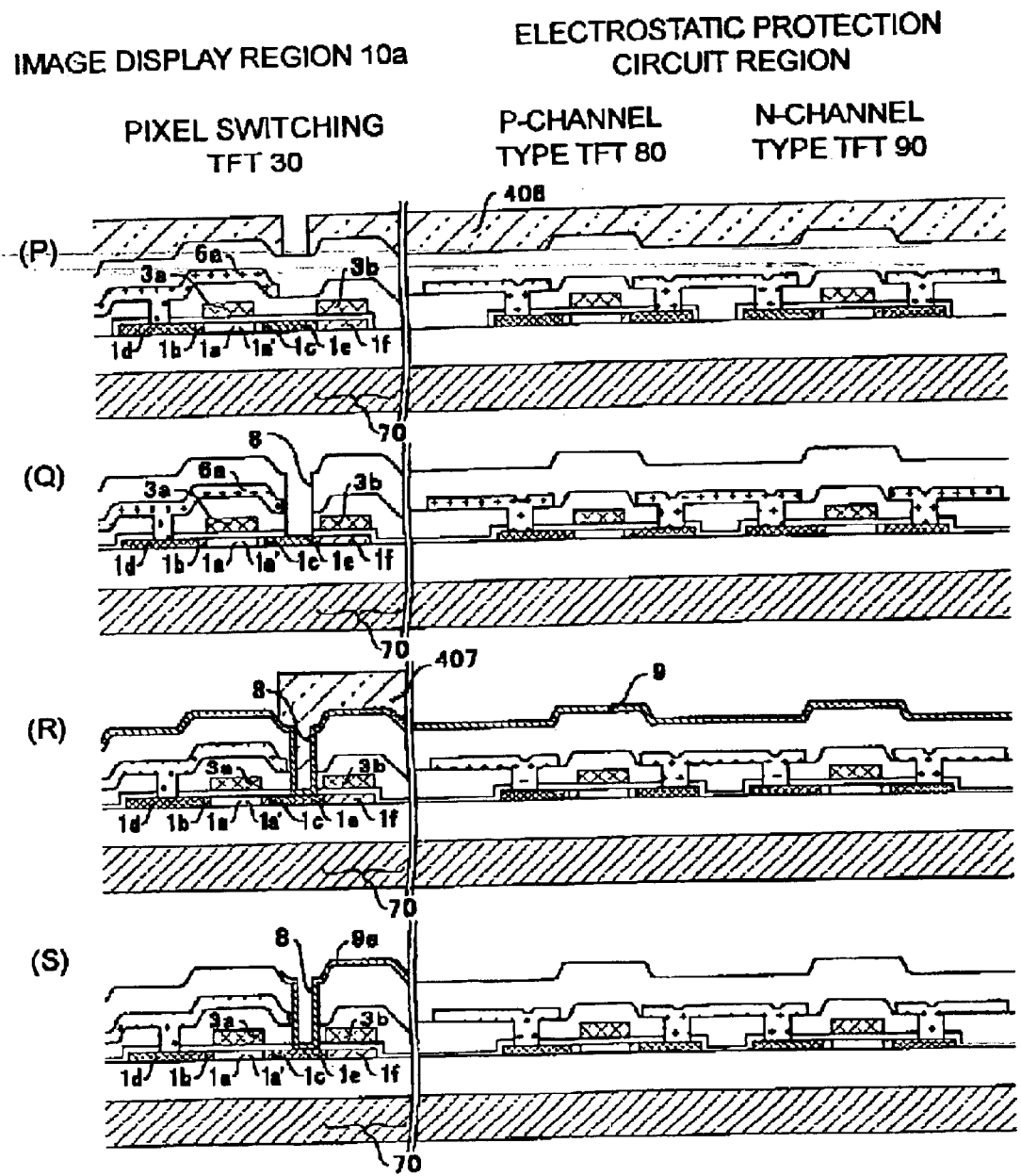
FIGS. 16(P) through 16(S) are cross sectional views of process showing a fabricating method of the TFT array substrate according to the mode for carrying out the invention 1 of present invention.

FIGS. 9 and 10, respectively, are an equivalent circuit diagram and a plan view showing an electrostatic protection circuit formed on the TFT array substrate according to the present mode and a peripheral layout thereof. FIG. 11 is a cross sectional view when a TFT that constitutes the electrostatic protection circuit and intersections of wirings are cut with a C–C' line, a C1–C1' line, and a C2–C2' line of FIG. 10.

As shown in FIGS. 9 and 10, all of a signal input terminal 670 receive a signal that is input from the outside, a terminal 710 receives a high potential VDDX that is supplied from the outside, and a terminal 720 receives a low potential VSSX that is supplied from the outside are arranged along a substrate side 111, and from the signal input terminal 670, the terminal 710 and the terminal 720, a signal input line 67, a high potential line 71 and a low potential line 72 extend toward an opposite substrate side 112 and reach a data line driving circuit 101. In addition, in the present mode, by use of a sideward position of the signal input line 67, an electrostatic protection circuit 5 is formed.

In the electrostatic protection circuit 5, as shown in FIGS. 9 through 11, in order that a p-channel TFT 80 and an n-channel TFT 90 each work as a normally-off diode, a gate electrode 65 and a source region 82 are fixed at a high potential VDDX, and a gate electrode 66 and a source region 92 are fixed at a low potential VSSX. In other words, in the TFTs 80 and 90, the high potential line 71 and the low potential line 72, respectively, are electrically connected to the source regions 82 and 92 through contact holes 63 and 64, and at the same time, the high potential line 71 and the low potential line 72, respectively, are electrically connected also to the gate electrodes 65 and 66 through contact holes 651 and 661. The signal input line 67 is electrically connected to the p-channel TFT 80 and n-channel TFT 90 at the drain regions 84 and 94, respectively through contact holes 68 and 69.

Since the electrostatic protection circuit 5 like this is formed through a process similar to that of the image display region 10a, the semiconductor film 60 constituting the TFTs 80 and 90 for use in the electrostatic protection circuit is formed island-like on an upper layer of the substrate protection film 12 on the transparent substrate 10b. Furthermore, also in the formation region 50 of the electrostatic protection circuit 5, the interlayer insulating films 4 and 7 and the gate insulating film 2 are formed. Still furthermore, the TFTs 80 and 90 for use in the electrostatic protection circuit also, similarly to the pixel switching TFT 30, have an LDD structure, on both sides of the channel formation regions 81 and 91, a source region formed of the high concentration source regions 82 and 92 and low concentration source regions 83 and 93, and a drain region formed of the high concentration drain regions 84 and 94 and the low concentration drain regions 85 and 95 are disposed.

When a high potential and a low potential are supplied to the electrostatic protection circuit 5 like this, in the present mode, the high potential line 71 and the low potential line 72 are formed so as to avoid a region that intersects a wiring portion 671 from a signal input terminal 670 to the electrostatic protection circuit 5 of the signal input line 67, accordingly the wiring portion 671 intersects neither the high potential line 71 nor the low potential line 72.

In other words, the high potential line 71 includes a first routing portion 711 that goes through a region more toward the substrate side 112 (the data line driving circuit 101 side) than a region where the signal input terminal 670 and the electrostatic protection circuit 5 are formed, and a second routing portion 712 that extends from the first routing portion 711 toward the substrate side 111 and reaches the source region 82 of the TFT 80 of the electrostatic protection circuit 5. Accordingly, although in the high potential line 71, the first routing portion 711 intersects the signal input line 67 at an intersection 672, the intersection 672 is located at a position more distant from the electrostatic protection circuit 5 when seen from the signal input terminal 670.

On the other hand, the low potential line 72 includes a first routing portion 721 that extends from the terminal 720 to a region more toward the substrate side 111 than a region where the signal input terminal 670 and the electrostatic protection circuit 5 are formed, a second routing portion 722 that extends along the substrate side 111 from the first routing portion 721 on a region more toward the substrate side 111 than a region where the signal input terminal 670 and the electrostatic protection circuit 5 are formed, and a third routing portion 723 that extends from the second routing portion 722 toward the substrate side 112 and reaches the source region 92 of the TFT 90 of the electrostatic protection circuit 5. Accordingly, the low potential line 72 does not at all intersect the signal input line 67.

As is obvious from FIGS. 9 and 10, the first routing portion 711 of the high potential line 71 and the low potential line 72 intersect at an intersection 717, and the first routing portion 711 of the high potential line 71 and the signal input line 67 intersect at an intersection 672. However, in the intersections 717 and 672, as shown in FIG. 11, while body portions of the high potential line 71, the low potential line 72 and the signal input line 67 are formed as layer of wiring higher than the interlayer insulating film 4, the body portions are partially intercepted at the intersections 672 and 717 and allowed going through the substrate wiring 3c that is in the same layer with the gate electrodes 66 and 67 and contact holes 718 and 719, and thereby electrical connection of the wirings and insulation at the intersections 717 and 672 are secured.

Thus, in the TFT array substrate 10 and liquid crystal device 100 according to the present mode, the signal input terminal 670, and the terminals 710 and 720 are arranged along the substrate side 111 of the TFT array substrate 10, at the same time, the signal input line 67 extends from the signal input terminal 670 toward the substrate side 112 and the electrostatic protection circuit 5 is disposed sideward from the signal input line 67. However, of the constant potential lines that supply constant potentials to the electrostatic protection circuit 5, the low potential line 72 does not at all interest the signal input line 67. Furthermore, the high potential line 71 intersects the signal input line 67 at the intersection 672 more distant from the electrostatic protection circuit 5 when seen from the signal input terminal 670, but does not intersect the wiring portion 671 from the signal input terminal 670 to the electrostatic protection circuit 5. Accordingly, even when a surge voltage caused by static electricity enters from the signal input terminal 670, the intersection between the signal input line 67 and the low potential line 72, or the intersection between the signal input line 67 and the high potential line 71 is not heated by the surge voltage. Accordingly, the surge voltage does not cause to disconnect the signal input line 67, the high potential line 71 and the low potential line 72. Furthermore, since the surge voltage does not punch through the interlayer insulating film 4 to the low potential line 72 and the high potential line 71, the interlayer short circuit can be inhibited. Accordingly, reliability of the liquid crystal device 100 can be improved.

With reference to FIGS. 12(A) through 16(S), a method of fabricating the TFT array substrate 10 will be explained.

FIGS. 12 through 16 are all cross sectional views of processes showing a fabricating method of the TFT array substrate 10 according to the present mode. The TFT that constitutes a driving circuit, being fabricated similarly to the TFT for use in the electrostatic protection circuit, is omitted from showing in the drawings and explaining thereof.

In the present mode, first, as shown in FIG. 12(A), a transparent substrate 10b cleansed by use of ultrasonic cleaning is prepared, thereafter under a temperature condition where a substrate temperature is in the range of 150 to 450 degree centigrade, over an entire surface of the transparent substrate 10b, in order to form a substrate protection film 12, by use of a plasma CVD method, an insulating film made of a silicon oxide film is formed in a thickness of 300 to 500 nm. As a raw material gas at this time, for instance, a gas mixture of monosilane and a laughter gas, TEOS and oxygen, or disilane and ammonia can be used.

Next, as shown in FIG. 2(B), under a temperature condition where the substrate temperature is 150 to 450 degree centigrade, over an entire surface of the transparent substrate 10b, a semiconductor film 1 made of an amorphous silicon film is deposited by use of a plasma CVD method in a thickness of 50 to 100 nm. As a raw material gas at this time, for instance, disilane or monosilane can be used. Subsequently, a laser light is irradiated onto the semiconductor film 1 to apply laser annealing. As a result, the amorphous semiconductor film 1, after once melted, crystallizes through a cooling/solidifying process. At this time, since an irradiation time period of a laser light onto each region is extremely short and an irradiation area also is localized relative to an entire substrate, a whole substrate is not simultaneously heated to a high temperature. Accordingly, even when a glass substrate is used as the transparent substrate 10, there occurs no deformation or cracking due to heat.

In the next place, as shown in FIG. 12(C), by use of photolithography, a resist mask 402 is formed on a surface of the semiconductor film 1. Subsequently, from an opening of the resist mask 402, the semiconductor film 1 is etched, and as shown in FIG. 12(D), a semiconductor film 1a that constitutes a pixel switching TFT 30, and TFTs 80 and 90 for use in an electrostatic protection circuit are formed island-like followed by removing the resist mask 402.

Subsequently, as shown in FIG. 13(E), by use of a CVD method or the like, a gate insulating film 2 made of a silicon oxide film is formed on the semiconductor films 1a and 60. Though omitted from showing in the drawing, through a predetermined resist mask, an impurity ion is implanted on an extension 1f of the semiconductor film 1a, and thereby a bottom electrode that constitutes a storage capacitance 70 with a capacitance line 3b is formed.

Subsequently, as shown in FIG. 13(F), in order to form a scanning line 3a, a capacitance line 3b, and gate electrodes 65, 66, over an entire surface of the substrate 10b, a conductive film 3 made of a material, such as tungsten silicide or molybdenum silicide, is formed. Thereafter, by use of the photolithography, a resist mask 403 is formed on a surface of the conductive film 3, then the conductive film 3 is etched through an opening of the resist mask 403, and thereby as shown in FIG. 13(G) the scanning line 3a, the capacitance line 3b and the gate electrodes 65, 66 are formed.

Next, as shown in FIG. 14(H), with the semiconductor film 60 thereon a p-channel TFT 80 for use in the electrostatic protection circuit is to be formed covered with a resist mask 411, with the scanning line 3a and the gate electrode 66 as a mask, a low concentration n-impurity ion (phosphorus ion) is implanted at a dose amount of approximately $0.1 \times 10^{13}/cm^2$ to $10 \times 10^{13}/cm^2$ onto the semiconductor film 1a that constitutes a pixel switching TFT 30 and the semiconductor film 60 that constitutes a n-channel TFT 90 for use in the electrostatic protection circuit. Thereby a low concentration source regions 1b, 93 and a low concentration drain regions 1c, 95 are formed in a self-alignment manner with respect to the scanning line 3a and the gate electrode 66. Portions that are located immediately below the scanning line 3a and the gate electrode 66 and are not impurity-ion implanted become channel regions 1a', 91 with no change to the semiconductor films 1a, 60.

Next, as shown in FIG. 14(I), a resist mask 412 that is wider than the scanning line 3a and the gate electrode 66, and covers the semiconductor film 60 that is used to form the p-channel TFT 80 for use in the electrostatic protection circuit is formed. In this state, a high concentration n-impurity ion (phosphorus ion) is implanted at a dose amount of approximately $0.1 \times 10^{15}/cm^2$ to $10 \times 10^{15}/cm^2$, and thereby high concentration source regions 1d, 92 and a high concentration drain regions 1e, 94 are formed.

In the next place, as shown in FIG. 14(J), with the semiconductor films 1a, 60 thereon the n-channel TFTs 30, 90 are to be formed covered with a resist mask 413, with the gate electrode 65 as a mask, a low concentration impurity ion (boron ion) is implanted at a dose amount of approximately $0.1 \times 10^{13}/cm^2$ to $10 \times 10^{13}/cm^2$ onto the semiconductor film 60 that constitutes the p-channel TFT 80 for use in the electrostatic protection circuit. Thereby a low concentration source region 83 and a low concentration drain region 85 are formed in a self-alignment manner with respect to the gate electrode 65. A portion that is located immediately below the gate electrode 65 and is not impurity-ion implanted becomes a channel region 81 with no change to the semiconductor film 60.

Next, as shown in FIG. 14(K), a resist mask 414 that is wider than the gate electrode 65 and covers the semiconductor films 1a, 60 thereon the n-channel TFTs 30, 90 are to be formed is formed, and in this state, a high concentration p-impurity ion (boron ion) is implanted at a dose amount of approximately $0.1 \times 10^{15}/cm^2$ to $10 \times 10^{15}/cm^2$. Thereby a high concentration source region 82 and a high concentration drain region 84 are formed.

Subsequently, as shown in FIG. 15(L), after an interlayer insulating film 4 made of a silicon oxide film or the like is formed over an entire surface of the substrate 10b, by use of the photolithography, a resist mask 404 is formed on a surface of the interlayer insulating film 4. In the next place, the interlayer insulating film 4 is etched from an opening of the resist mask 404, and as shown in FIG. 15(M), contact holes 5, 63, 64, 68 and 69 are formed followed by removing the resist mask 404.

Subsequently, as shown in FIG. 15(N), over an entire surface of the substrate 10b, an aluminum film 6 for constituting the data line 6a (source electrode) and various kinds of wirings is deposited in a thickness of 500 to 1000 nm, thereafter by use of the photolithography, a resist mask 405 is formed on a surface of the aluminum film 6. Next, the aluminum film 6 is etched from an opening of the resist mask 405, as shown in FIG. 15(O), the data line 6a, the high potential line 71, the low potential line 72 and the signal input line 67 are formed. As a result, the p-channel and n-channel TFTs 80, 90 that constitute the electrostatic protection circuit 5 are completed. Subsequently, the resist mask 405 is removed.

Subsequently, as shown in FIG. 16(P), an interlayer insulating film 7 made of a silicon oxide film or the like is formed. Thereafter, by use of the photolithography, a resist mask 406 is formed on a surface of the interlayer insulating film 7. In the next place, the interlayer insulating film 7 is etched from an opening of the resist mask 406, and thereby, as shown in FIG. 16(Q), a contact hole 8 is formed, and thereafter the resist mask 406 is removed.

Subsequently, as shown in FIG. 16(R), over an entire surface of the substrate 10b, a transparent conductive film, such as an ITO film 9, is formed. Thereafter, by use of the photolithography, a resist mask 407 is formed on a surface of the ITO film 9. In the next place, the ITO film 9 is etched from an opening of the resist mask 407, thereby as shown in FIG. 16(S), a pixel electrode 9a is formed, and thereafter the resist mask 407 is removed.

Thereafter, as shown in FIG. 6, an orientation film 16 is formed. As a result, a TFT array substrate 10 is completed.

Figure 17:
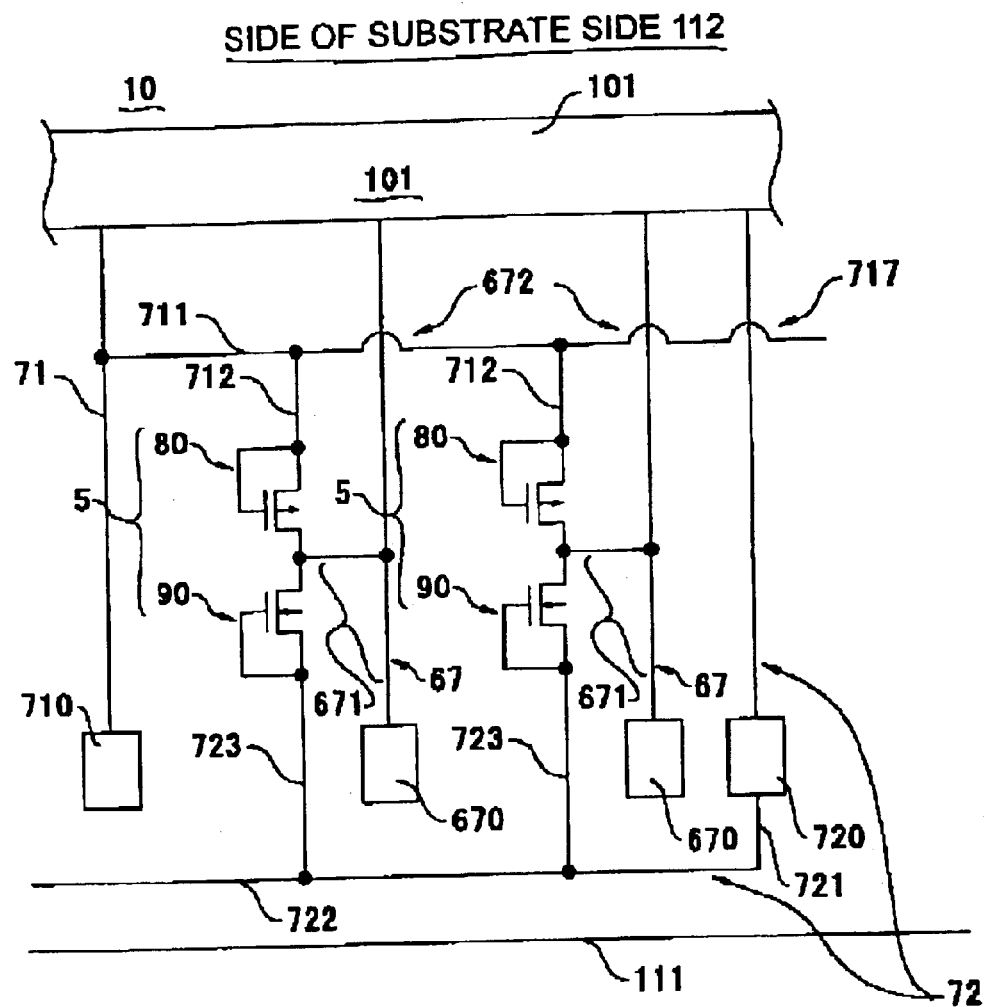
FIG. 17 is an equivalent circuit diagram showing a layout of an electrostatic protection circuit and the surroundings thereof in a TFT array substrate used in a liquid crystal device according to a mode for carrying out the invention 2 of the present invention.
Figure 18:
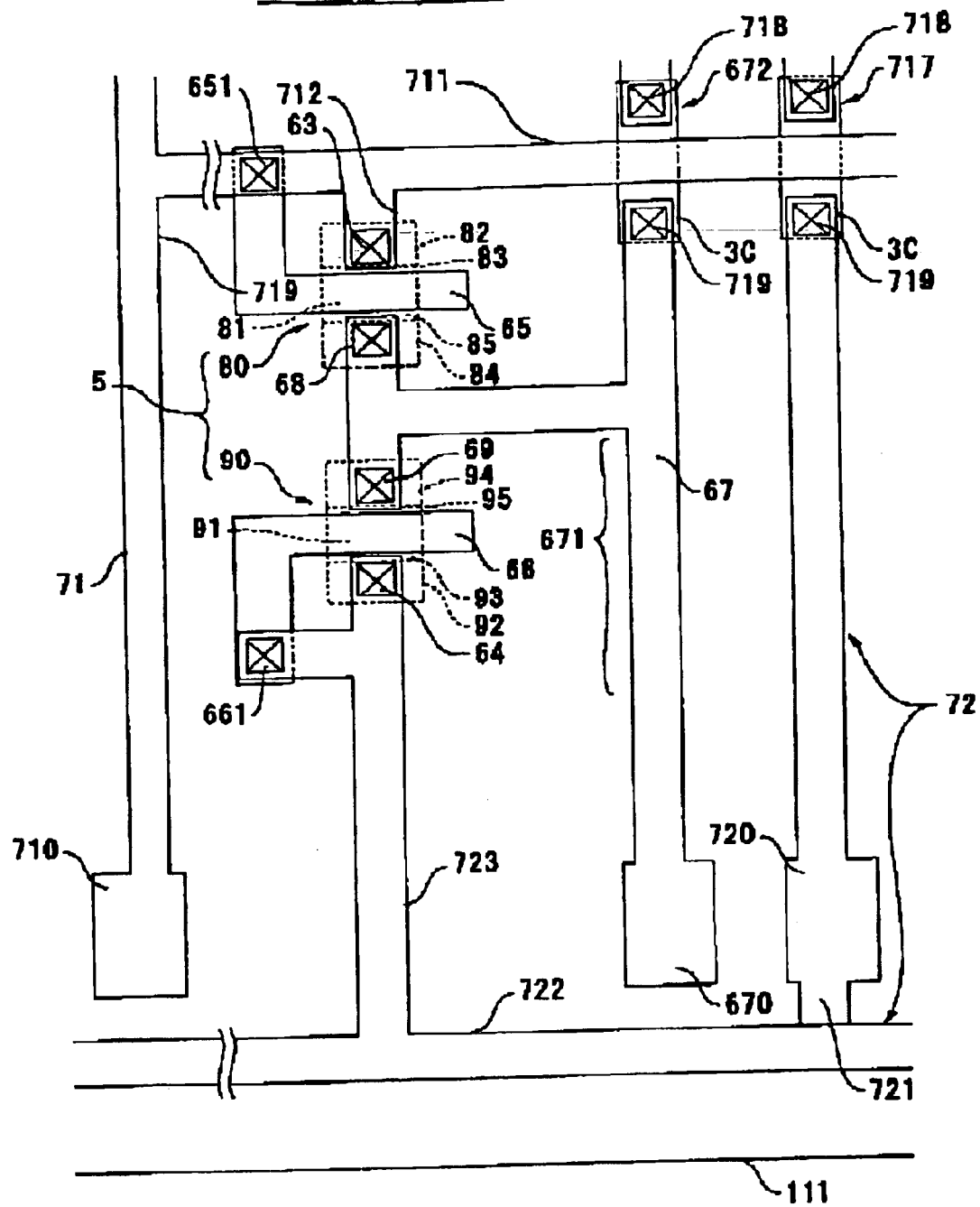
FIG. 18 is a plan view showing a layout of an electrostatic protection circuit and the surroundings thereof in the TFT array substrate used in a liquid crystal device according to a mode for carrying out the invention 2 of the present invention.

FIGS. 17 and 18, respectively, are an equivalent circuit diagram and a plan view showing an electrostatic protection circuit formed on a TFT array substrate according to the present mode and a layout of the surroundings thereof.

In the mode for carrying out the invention 1, in the neighborhood of the substrate side 111 of the TFT array substrate 10, between the signal input terminal 670 and the signal input line 67 and the terminal 710 thereto a high potential is supplied and the high potential line 71, the terminal 720 thereto a low potential is supplied and the low potential line 72 are disposed. However, as shown in FIGS. 17 and 18, even when the signal input terminal 670 and the signal input line 67 are disposed between the terminal 710 thereto a high potential is supplied and the high potential line 71 and the terminal 720 thereto a low potential is supplied and the low potential line 72, the present invention can be applied.

In other words, even in an example shown in FIGS. 17 and 18, the high potential 71 includes a first routing portion 711 that goes through a region more toward the substrate side 12 (the data line driving circuit 101 side) than a region where the signal input terminal 670 and the electrostatic protection circuit 5 are formed, and a second routing portion 712 that extends from the first routing portion 711 toward the substrate side 111 and reaches a source region 82 of a TFT 80 of the electrostatic protection circuit 5. Accordingly, in the high potential line 71, though the first routing portion 711 thereof intersects the signal input line 67 at the intersection 672, the intersection 672, among the signal input line 67, is located at a position more distant from the electrostatic protection circuit 5 when seen from the signal input terminal 670.

On the other hand, the low potential line 72 includes a first routing portion 721 that extends from the terminal 720 to a region more toward the substrate side 111 than a region where the signal input terminal 670 and the electrostatic protection circuit 5 are formed, a second routing portion 722 that extends along the substrate side 111 from the first routing portion 721 at a region more toward the substrate side 111 than a region where the signal input terminal 670 and the electrostatic protection circuit 5 are formed, and a third routing portion 723 that extends from the second routing portion 722 to the substrate side 112 and reaches the source region 92 of the TFT 90 of the electrostatic protection circuit 5. Accordingly, the low potential line 72 does not at all intersect the signal input line 67.

Other configurations are similar to the mode for carrying out the invention 1. Accordingly, common portions are given the same reference numerals in the drawings and explanations thereof will be omitted.

Thus, even in the present mode, the high potential line 71 and the low potential line 72 do not intersect the wiring portion 671 from the signal input terminal 670 to the electrostatic protection circuit 5 of the signal input line 67. Accordingly, even when a surge voltage enters from the signal input terminal 670, at the intersection between the signal input line 67 and the low potential line 72, or between the signal input line 67 and the high potential line 71, heat generation is not caused by the surge voltage. Furthermore, even when a surge voltage enters from the signal input terminal 670, the surge voltage does not punch through the interlayer insulating film 4 to the low potential line 72 or the high potential line 71. Accordingly, reliability of the liquid crystal device 100 can be improved.

Figure 19:
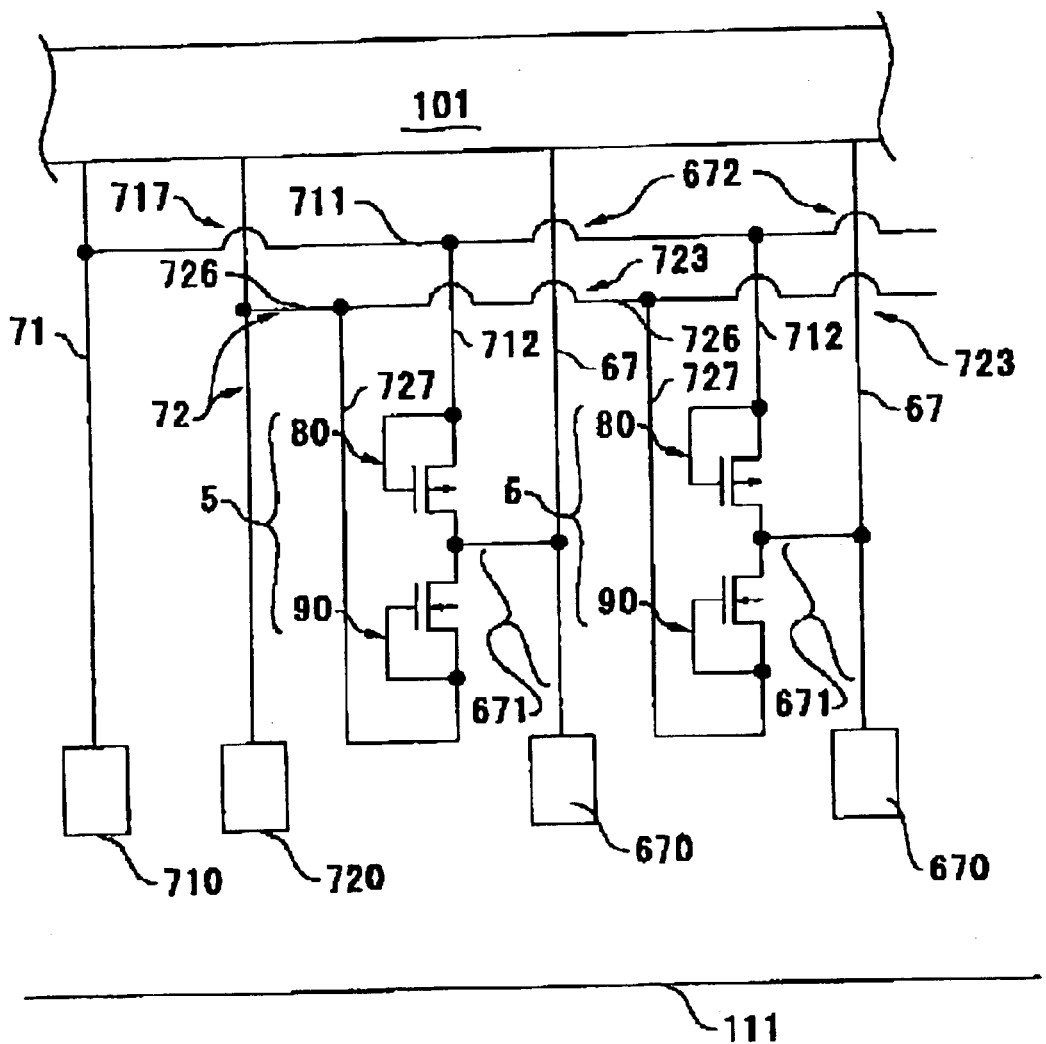
FIG. 19 is an equivalent circuit diagram showing a layout of an electrostatic protection circuit and the surroundings thereof in a TFT array substrate used in a liquid crystal device according to a mode for carrying out the invention 3 of the present invention.
Figure 20:
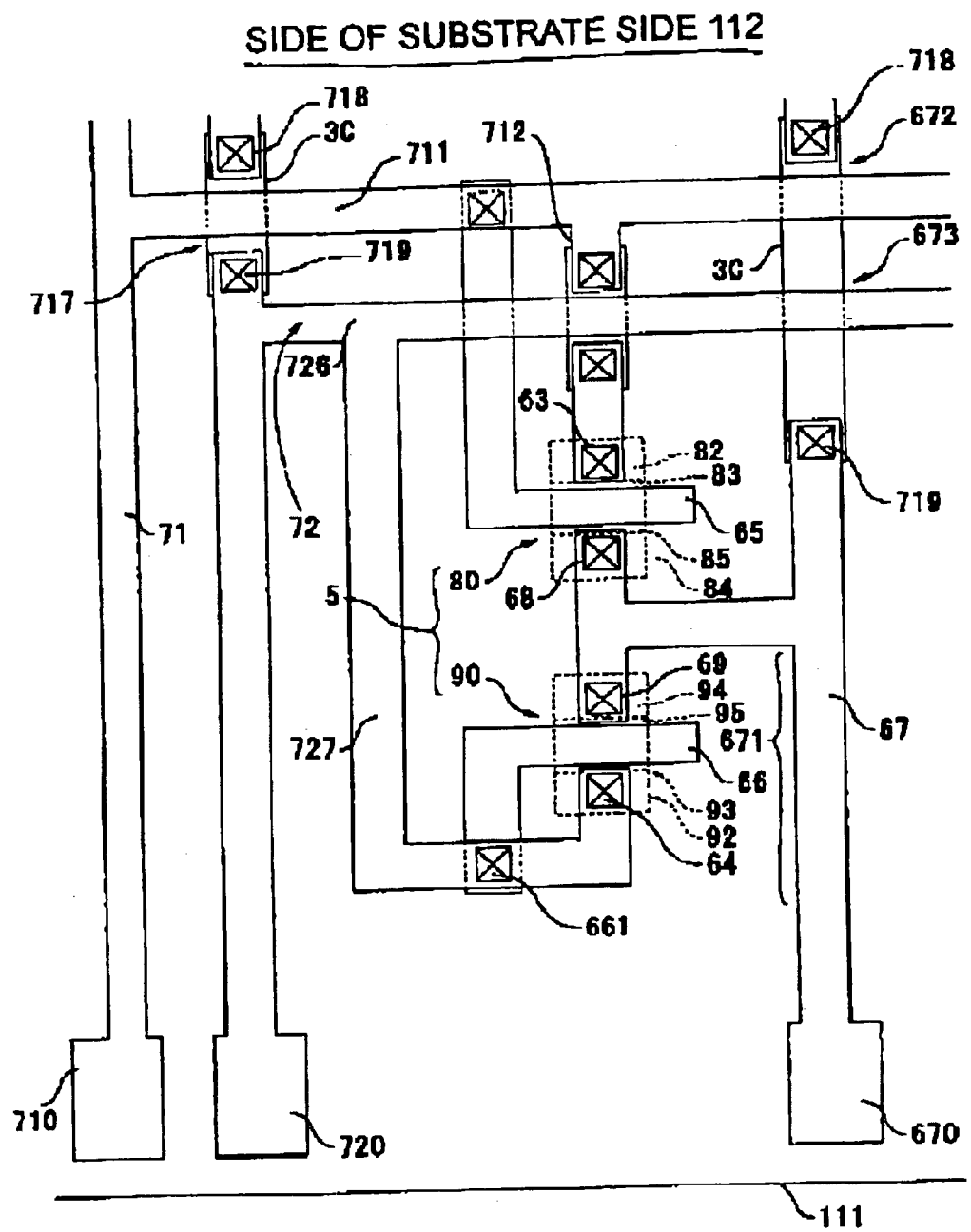
FIG. 20 is a plan view showing a layout of an electrostatic protection circuit and the surroundings thereof in the TFT array substrate used in a liquid crystal device according to a mode for carrying out the invention 3 of the present invention.

FIGS. 19 and 20, respectively, are an equivalent circuit diagram and a plan view showing a layout of an electrostatic protection circuit formed on a TFT array substrate according to the present mode and the surroundings thereof.

In the modes for carrying out the invention, the high potential line 71 is routed through a region more toward the substrate side 112 (data line driving circuit 101 side) than a region where the signal input terminal 670 and the electrostatic protection circuit 5 are formed, and the low potential line 72 is routed from the terminal 720 through a region more toward the substrate side 111 than a region where the signal input terminal 670 and the electrostatic protection circuit 5 are formed. However, in the present mode, as shown in FIGS. 19 and 20, both the high potential line 71 and the low potential line 72 are routed through a region more toward the substrate side 112 (data line driving circuit 101 side) than a region where the signal input terminal 670 and the electrostatic protection circuit 5 are formed.

That is, the high potential 71 includes a first routing portion 711 that goes through a region more toward the substrate side 112 (the data line driving circuit 101 side) than a region where the signal input terminal 670 and the electrostatic protection circuit 5 are formed, and a second routing portion 712 that extends from the first routing portion 711 toward the substrate side 111 and reaches the source region 82 of the TFT 80 of the electrostatic protection circuit 5. Accordingly, in the high potential line 71, though the first routing portion 711 thereof intersects the signal input line 67 at the intersection 672, the intersection 672 of the signal input line 67 is located at a position more distant than the electrostatic protection circuit 5 when seen from the signal input terminal 670.

Furthermore, the low potential line 72 also includes a first routing portion 726 that goes through a region more toward the substrate side 112 (data line driving circuit 101 side) than a region where the signal input terminal 670 and the electrostatic protection circuit 5 are formed, and a second routing portion 727 that extends from the first routing portion 726 toward the substrate side 111 and reaches the source region 92 of the TFT 90 of the electrostatic protection circuit 5. Accordingly, in the low potential line 72, though the first routing portion 726 intersects the signal input line 67 at the intersection 673, the intersection 673 is located, among the signal input line 67, at a position more distant than the electrostatic protection circuit 5 when seen from the signal input terminal 670.

Other configurations are similar to those of the mode for carrying out the invention 1. Accordingly, common portions are given the same reference numerals in the drawings and explanations thereof will be omitted.

Thus, even in the present mode, the high potential line 71 and the low potential line 72 do not intersect the wiring portion 671 from the signal input terminal 670 to the electrostatic protection circuit 5 of the signal input line 67. Accordingly, even when a surge voltage enters from the signal input terminal 670, at the intersection between the signal input line 67 and the low potential line 72, or between the signal input line 67 and the high potential line 71, heat generation due to the surge voltage is not caused. Furthermore, even when a surge voltage enters from the signal input terminal 670, the surge voltage does not punch through the interlayer insulating film 4 to the low potential line 72 or the high potential line 71. Accordingly, reliability of the liquid crystal device 100 can be improved.

In the above modes for carrying out the invention 1 through 3, as the TFTs 80 and 90 for use in an electrostatic protection circuit, one single gate TFT is used to illustrate. However, as FIG. 21(A) shows a p-channel TFT for use in an electrostatic protection circuit, for instance, by use of two TFTs 801, 802 in parallel, an on-current may be increased.

Furthermore, as FIG. 21(B) shows a p-channel TFT for use in an electrostatic protection circuit, two TFTs 803 and 804 may be used in series to improve a withstand voltage. In this case, a dual gate structure where two gate electrodes 65 are disposed to one semiconductor film 60, or, though omitted from showing in the drawing, a triple gate structure where three gate electrodes 65 are disposed may be adopted.

In the above mode, as a semiconductor device, a TFT array substrate that is used in an active matrix type liquid crystal device is illustrated. However, the present invention may be applied to a semiconductor device that constitutes an electro-optic device in which an electro-optic material other than a liquid crystal is used, or a semiconductor device other than an electro-optic device.

In the next place, one example of an electronic instrument that is provided with a liquid crystal device 100 (electro-optic device) thereto the present invention is applied will be explained with reference to FIG. 22, FIGS. 23(A) and 23(B).

FIG. 22 is an exemplary block diagram showing a configuration of an electronic instrument provided with a liquid crystal device 100 formed similarly to electro-optic devices according to the above respective modes. FIGS. 23(A) and 23(B), respectively, are an explanatory diagram of a mobile personal computer and a portable telephone as an example of an electronic instrument that uses a liquid crystal device according to the present invention.

In FIG. 22, an electronic instrument includes a display information output source 1000, a display information process circuit 1002, a driving circuit 1004, a liquid crystal device 100, a clock generator 1008, and a power supply 1010. The display information output source 1000 includes memories such as a ROM (Read Only Memory), a RAM (Random Access Memory), and a memory like an optical disc, and a synchronizing circuit for outputting image signals such as TV signals in a synchronized manner, and processes, based on clocks from the clock generator 1008, the image signals in the predetermined format and outputs to the display information process circuit 1002. The display information output 1002 is constituted including various kinds of well known process circuits, such as an amplifier, an inverter, a phase developing circuit, a rotating circuit, a gamma correction circuit, or a clamp circuit, and sequentially generates digital signals from the display information, which is input based on the clock signals, and outputs the generated signals together with the clock signals CLKs to the driving circuit 1004. The driving circuit 1004 drives the liquid crystal device 100. A power supply 1010 supplies predetermined electric powers to the above respective circuits. The driving circuit 1004 may be formed on a TFT array substrate that constitutes the liquid crystal device 100, in addition to this, the display information process circuits 1002 also may be formed on the TFT array substrate.

As the electronic instruments thus configured, a projector type liquid crystal device (liquid crystal projector), multimedia adaptable personal computer (PC) and engineering work station (EWS), a pager or a portable telephone, a word processor, a TV, a view-finder type or monitor direct view type video tape recorder, an electronic diary, an electronic desk-top calculator, a car navigation device, a POS terminal, a touch panel, and the like can be included.

As shown in FIG. 23(A), a personal computer 80 has a body 82 provided with a keyboard 81, and a liquid crystal display unit 83. The liquid crystal display unit 83 can include the above liquid crystal device 100.

Furthermore, as shown in FIG. 23(B), a portable telephone 90 that can include a plurality of operational buttons 91 and a display portion having the above liquid crystal device 100.

As explained above, in the present invention, constant potential lines for supplying constant potentials to an electrostatic protection circuit are formed so as not to intersect a portion that reaches from a signal input terminal of a signal input line to the electrostatic protection circuit. Accordingly, even when a surge voltage enters from the signal input terminal, heat generation is not caused at an intersection between the signal input line and the low potential line by the surge voltage. Accordingly, even when the surge voltage enters, the signal input line and the low potential line can be avoided from disconnecting. Furthermore, even when the surge voltage enters from the signal input terminal, since the surge voltage does not punch through an interlayer insulating film to the constant potential line, an interlayer short circuit can be inhibited from occurring.

Accordingly, reliability of a semiconductor device can be improved.

What is claimed is:

1. A semiconductor device including, on a substrate, a plurality of signal input terminals, a plurality of signal input lines extended from each of the plurality of signal input terminals, and an electrostatic protection circuit that electrically connects to a middle position of a predetermined signal input line of the signal input lines:

wherein a constant potential line that supplies a constant potential to the electrostatic protection circuit is formed so as to avoid at least a region that intersects a wiring portion from the signal input terminal to the electrostatic protection circuit in the predetermined signal input line.

2. The semiconductor device as set forth in claim 1:

wherein the plurality of signal input terminals is arranged along a first substrate side of the substrate, and the plurality of signal input lines extends from the plurality of the signal input terminals each toward a second substrate side that is opposite to the first substrate side and the electrostatic protection circuit is disposed sideward of the signal input line in the substrate.

3. The semiconductor device as set forth in claim 2:

wherein the terminal connected to the constant potential line is also arranged along the first substrate side.

4. The semiconductor device as set forth in claim 2:

wherein the constant potential line routes through a region more toward the first substrate side or a region more toward the second substrate side than a region where the signal input terminal and the electrostatic protection circuit are formed, and extends to the electrostatic protection circuit.

5. The semiconductor device as set forth in claim 2:

wherein the constant potential line has a high potential line that supplies a high potential to the electrostatic protection circuit and a low potential line that supplies a low potential to the electrostatic protection circuit;

wherein while one contact potential line of the high potential line and the low potential line routes through a region more toward the second substrate side than a region where the signal input terminal and the electrostatic protection circuit are formed and extends to the electrostatic protection circuit;

the other constant potential line routes through a region more toward the first substrate side than a region where the signal input terminal and the electrostatic protection circuit are formed and extends to the electrostatic protection circuit.

6. The semiconductor device as set forth in claim 2:

wherein the constant potential line has a high potential line that supplies a high potential to the electrostatic protection circuit and a low potential line that supplies a low potential to the electrostatic protection circuit;

wherein both of the high potential line and the low potential line route through a region more toward the first substrate side or a region more toward the second substrate side than a region where the signal input terminal and the electrostatic protection circuit are formed and extends to the electrostatic protection circuit.

7. The semiconductor device as set forth in claim 1:

wherein the electrostatic protection circuit includes a thin film transistor whose gate and source are fixed at constant potentials so as to be a normally-off state.

8. The semiconductor device as set forth in claim 1:

wherein the electrostatic protection circuit includes a plurality of thin film transistors connected in series in a state where a gate and a source are fixed at a constant potential so as to be a normally-off state.

9. The semiconductor device as set forth in claim 8:

wherein the plurality of thin film transistors, by having a dual gate structure or a triple gate structure, is configured in a structure where the plurality of thin film transistors is connected in series.

10. The semiconductor device as set forth in claim 5:

wherein the electrostatic protection circuit includes a first conductivity type thin film transistor and a second conductivity type thin film transistor connected in series in a state where a gate and a source are fixed at a constant potential so as to be a normally-off state.

11. The semiconductor device as set forth in claim 1:

wherein the electrostatic protection circuit includes a plurality of thin film transistors that is connected in parallel in a state where a gate and a source are fixed at a constant potential so as to be a normally-off state.

12. The semiconductor device as set forth in claim 8:

wherein the thin film transistor has an LDD structure.

13. An electro-optic device that uses the semiconductor device provided in claim 1 as a transistor substrate that holds an electro-optic material:

wherein the signal input line extends up to a driving circuit that drives pixels formed in matrix on the transistor array substrate.

14. The electro-optic device as set forth in claim 13:

wherein the transistor array substrate and an opposite substrate disposed opposite to the transistor array substrate hold a liquid crystal therebetween as the electro-optic material.

15. An electronic instrument, including:

an electro-optic device provided in claim 13.

* * * * *